(12) United States Patent
Byrne et al.

(10) Patent No.: US 9,095,834 B2
(45) Date of Patent: Aug. 4, 2015

(54) PLASMA BASED SURFACE AUGMENTATION METHOD

(75) Inventors: Cormac Patrick Byrne, Belfast (GB); Brian Joseph Meenan, Lisburn (GB); Raechelle Andrea D'Sa, Belfast (GB)

(73) Assignee: Innovation Ulster Limited, Coleraine, Northern Ireland (GB)

( * ) Notice: Subject to any disclaimer, the term of this patent is extended or adjusted under 35 U.S.C. 154(b) by 0 days.

(21) Appl. No.: 13/984,582

(22) PCT Filed: Feb. 8, 2012

(86) PCT No.: PCT/GB2012/000130
§ 371 (c)(1),
(2), (4) Date: Sep. 12, 2013

(87) PCT Pub. No.: WO2012/107723
PCT Pub. Date: Aug. 16, 2012

(65) Prior Publication Data
US 2014/0147603 A1    May 29, 2014

(30) Foreign Application Priority Data
Feb. 9, 2011    (GB) .................................. 1102337.1

(51) Int. Cl.
*H05H 1/24*    (2006.01)
*B01J 19/08*    (2006.01)
*H01J 37/32*    (2006.01)

(52) U.S. Cl.
CPC ........... *B01J 19/08* (2013.01); *H01J 37/32009* (2013.01); *H01J 37/32366* (2013.01); *H01J 37/32568* (2013.01)

(58) Field of Classification Search
CPC ................. B01J 19/08; H01J 37/32009; H01J 37/32348; H01J 37/32366; H01J 37/32568; H01J 37/32733; H05H 1/00; H05H 1/2406; H05H 2001/2425; H05H 2001/2431
USPC ......................................................... 427/569
See application file for complete search history.

(56) References Cited

U.S. PATENT DOCUMENTS 3,609,526 A * 9/1971 Chaberski .................... 324/226
5,110,437 A   5/1992 Yamada et al.
(Continued)

FOREIGN PATENT DOCUMENTS

| JP | 02-267274 | 11/1990 |
|----|-----------|---------|
| JP | 2008060496 | 3/2008 |

(Continued)

OTHER PUBLICATIONS

Merriam-Webster's Collegiate Dictionary, tenth edition, p. 1014.*

*Primary Examiner* — Elena T Lightfoot
(74) *Attorney, Agent, or Firm* — Diederiks & Whitelaw, PLC

(57) ABSTRACT

A method of modifying a substrate using a plasma comprises providing a first electrode and a second electrode; arranging the substrate such that only a portion of the substrate is between the electrodes; and rotating either the substrate or at least one of the electrodes about an axis so as to cause different portions of the substrate to pass between the electrodes during the rotation. A voltage is supplied to at least one of the electrodes so as to create a plasma discharge between the electrodes which contacts at least the portions of the substrate that pass between the electrodes. The electrodes and the substrate are arranged such that the rotating causes the speed of transit of the substrate portion between the electrodes to vary in a radial direction away from the axis of rotation and the rate that the plasma discharge modifies the substrate varies across the substrate.

33 Claims, 22 Drawing Sheets

(56) References Cited

U.S. PATENT DOCUMENTS

| | | | |
|---|---|---|---|
| 5,294,568 A * | 3/1994 | McNeilly et al. | 438/706 |
| 5,711,814 A | 1/1998 | Mori | |
| 5,951,814 A * | 9/1999 | Saito et al. | 156/345.1 |
| 6,189,485 B1 | 2/2001 | Matsuda et al. | |
| 6,441,554 B1 * | 8/2002 | Nam et al. | 315/111.21 |
| 6,586,055 B1 | 7/2003 | Nakahama et al. | |
| 2005/0005851 A1 | 1/2005 | Keshner et al. | |
| 2007/0052355 A1 * | 3/2007 | Zimmermann | 313/512 |
| 2007/0227668 A1 * | 10/2007 | Iizuka | 156/345.48 |
| 2007/0251919 A1 | 11/2007 | Imai | |
| 2009/0061087 A1 | 3/2009 | Endo et al. | |
| 2009/0126634 A1 | 5/2009 | Yamazawa | |

FOREIGN PATENT DOCUMENTS

| | | |
|---|---|---|
| JP | 2008182176 | 8/2008 |
| WO | WO 2009/032960 | 3/2009 |

* cited by examiner

PLASMA BASED SURFACE AUGMENTATION METHOD

CROSS-REFERENCE TO RELATED APPLICATIONS

This application represents a National Stage application of PCT/GB2012/000130 entitled "A plasma Based Surface Augmentation Method" filed Feb. 8, 2012, pending.

FIELD OF THE INVENTION

The present invention relates to a process and system for modifying the surface of a substrate using a plasma discharge process.

BACKGROUND OF THE INVENTION

It is known that substrates with specific predetermined surface properties can influence biological and related events and testing thereof. For example, the behaviour and response of cells, proteins and biomolecules of various kinds, including those associated with the immune system can be influenced by chemical and structural characteristics and properties. Control of such events may be useful in areas such as medical implants, oncology, stem cell culture, deep vein thrombosis, drug delivery, biomarker identification, etc. Typically, substrates used in any form of diagnosis or treatment have inherent surface properties that will facilitate a form of action with a biological environment or test platform. In order to optimise the interaction between the surface of a substrate and the cells or biomolecules concerned its surface may be treated in some manner. However, in many cases such treatment procedures are lengthy and resource intensive.

The present invention provides an improved method and system for treating a substrate which may be useful in the above field of technology and in other fields of technology such as the nanotechnology sector, e.g. in carbon nanomaterials, biosensors, fuel cells, batteries, nanochemistry, photocatalysis, solar cells, nanoelectronics, and nanoparticles for drug delivery.

The invention can be used to develop a wide range of functional properties, including physical, chemical, electrical, electronic, magnetic, mechanical, wear-resistant and corrosion-resistant properties at the required substrate surfaces. It is also possible to use the process described herein to form coatings of new materials, graded deposits, multi-component deposits, etc. Therefore, the present invention will be of interest to many industries such as automotive, aerospace, missile, power, electronic, biomedical, textile, petroleum, petrochemical, chemical, steel, cement, machine tools and construction industries.

SUMMARY OF INVENTION

According to a first aspect, the present invention provides a method of modifying a substrate as claimed in claim 1.

The plasma discharge is preferably driven by applying a high voltage to one of the electrodes. The term 'high voltage' is intended to mean a voltage sufficient to generate a plasma discharge between the electrodes. It will be appreciated that the plasma may be achieved by supplying said high voltage to at least one of the electrodes. Preferably the plasma discharge process occurs at or close to atmospheric pressure. Preferably, the plasma discharge process is a dielectric barrier discharge process.

Various parameters may be varied with time so as to change the plasma condition between the electrodes. As such, the process may be used to provide different areas on the substrate with different surface modifications or with different degrees of the same modification. The system therefore enables the application of inherently different chemical and topological changes in relatively close proximity on the substrate and in rapid succession. For example, the invention described herein will allow the user to create a substrate with a varied surface chemistry or topography so that the user can test against multiple conditions on the same substrate at the same time. This reduces overall testing requirements, and allows the optimum substrate properties to be identified more rapidly. Also, such a varied substrate surface can be used in order to invoke a variation in the response of cells, proteins and other biomolecules that may be applied to the substrate.

Preferably, a gas is present between the electrodes so that when the high voltage is applied an electrical discharge is provided through the gas between the electrodes to create the plasma. The electrodes and substrate to be treated are arranged such that as the substrate or one of the electrodes rotates only a portion of the substrate passes between the electrodes and so that only a portion of the substrate is exposed to and treated by the plasma at any given time.

Preferably, the first and/or second electrode extends in a direction perpendicular to said axis of rotation so that the plasma generated between the electrodes is in contact with an area of said substrate that extends in a direction perpendicular to the axis of rotation.

At least a portion of the first electrode and at least a portion of the second electrode are preferably substantially parallel to each other and define a gap between the substantially parallel portions. Part of the substrate passes through this gap as the substrate (or one or both of the electrodes) rotates about the axis of rotation. It will be appreciated that the plasma is generated between these parallel portions of the electrodes and treats the surface of the substrate in this gap. The substrate is preferably substantially planar and the plane of the substrate is preferably substantially parallel to the portions of the electrodes between which the substrate is rotated.

Preferably, the substrate is arranged on a platen that is rotated (relative to said second electrode) about said axis so as to cause said rotating of the substrate. The platen preferably comprises a rotatable disc on which the substrate to be treated is mounted. The platen is preferably circular and centred on the axis of rotation. Alternatively, or additionally, the substrate to be treated may be circular.

The rotatable platen preferably comprises the first electrode. As such, the plasma is preferably generated between the substrate (which is mounted on the first electrode) and the second electrode. The first electrode may be a circular electrode centred about the axis of rotation of the platen and therefore also centred on the axis of rotation of the substrate. In one configuration, the first electrode may be covered in an electrical insulator. The electrical insulator may cover at least the surface of the first electrode on which the substrate is placed. Preferably, the first electrode is completely encased in an electrical insulator. If the first electrode can not be made electrically insulating, the second electrode is adjusted so as to create the conditions to create a plasma discharge. For example, the high voltage may be supplied to the second electrode (instead of to the first electrode) in order to create the plasma discharge.

The first and second electrodes are preferably arranged inside a chamber or other form of enclosure and the second electrode remains static relative to the chamber. In a less preferred embodiment the second electrode may be moveable in a direction radially towards and away from the axis of rotation.

Preferably, the second electrode extends along the first electrode (with a portion of the substrate therebetween) and in a direction radially outward from said axis of rotation. The second electrode is therefore preferably an elongated member, such as, for example, a wire electrode, a tubular electrode or a rod electrode. The second electrode preferably extends radially outwards from adjacent to the axis of rotation. The second electrode preferably extends radially outwards to an outer edge of the first electrode. When the first electrode is a circular electrode in the rotating platen, the second electrode preferably extends from the axis of rotation to the outer edge of the first electrode. Less preferably, the second electrode may be arranged in a non-radial direction and/or from a non-central position from the axis of rotation. The plasma is generated between the opposing portions of the first and second electrodes so as to treat the portion of the substrate that is between the electrodes.

Preferably, at least the portion of the second electrode that generates a plasma with the first electrode is a straight electrode. Less preferably, at least this portion of the second electrode may be curved or bent in other ways.

As the first and second electrodes preferably extend radially outwards from the axis of rotation of the substrate, the speed of transit of the substrate through the discharge region between the electrodes varies in a radial direction away from the axis of rotation. When further away from the axis of rotation, the substrate has a higher angular velocity relative to the angular velocity of the substrate when it is closer to said axis. As such, the substrate to be treated passes through the discharge region between the electrodes more quickly the further away from said axis the substrate is. As such, the energy dose delivered to the substrate by the plasma may decrease with increased distance from the axis of rotation. This effect may be used to treat different areas of the substrate by different amounts, such as by treating inner areas of the substrate more heavily than outer areas of the same substrate.

The second electrode may be an elongated member comprising a conduit and apertures along its length. Gas may be delivered through the conduit and the arrangement of said apertures may be located such that the gas exits the electrode and is delivered to the gap between the first and second electrodes at these various points. This gas may be used to generate the plasma when the high voltage is applied to the electrodes and/or to modify the surface of the substrate when the plasma is generated. Alternatively, or additionally, the gas may be used to purge the gap between the electrodes of other gases. The use of gases between the electrodes will be discussed in more detail below.

Less preferably, the second electrode may take the form of a point electrode, such as the tip of a wire (e.g. a ball-tipped wire). In this arrangement, the plasma is generated between the point electrode and the first electrode. The point electrode may then be moved radially with respect to the axis of rotation. This electrode may be used to cause the discharge to occur in specific, discrete areas on the substrate.

Preferably, the second electrode is arranged vertically above the first electrode and preferably such that the axis of rotation of the substrate is vertical.

The high voltage may be applied to the electrodes so as to continuously generate a plasma therebetween. This may expose the entire surface of the substrate that passes between the electrodes to the plasma. Alternatively, the high voltage condition may be applied and deactivated sequentially in a "pulsed" manner such that the plasma generated therefrom contacts only a segment of the rotating substrate. The high voltage applied to the electrodes may be varied with time so as to vary the intensity or power produced in the plasma discharge. The high voltage may be varied continuously with time or as one or more step changes.

The high voltage may be repeatedly applied to the electrodes so as to cause a plurality of discharges that are temporally spaced. The frequency of the application of the high voltage may be varied with time.

The distance between the first and second electrodes may be varied with time whilst the plasma is being generated. A high voltage may be applied continuously so as to generate the plasma or may be repeatedly pulsed so as to repeatedly generate the plasma. The distance between the electrodes may therefore be varied whilst the plasma is being continuously generated or between successive pulses. By varying the gap between the electrodes in such a manner a dynamic plasma treatment environment is provided. At smaller electrode spacing the discharge filaments may be distributed within a smaller area on the substrate. At larger electrode spacing, the filaments act over a larger area which may produce a different surface treatment effect. Additionally, or alternatively to varying the spacing with time, the spacing between the electrodes may be varied as a function of the distance from the axis of rotation. Preferably, the spacing between the electrodes is maintained at a spacing of less than 5 mm in the regions in which the plasma is generated.

A portion of the substrate to be treated may be arranged so as to pass between the first electrode and a third (supplementary) electrode and a high voltage may be applied between the first and third electrodes so as to generate a plasma between these electrodes which treats the substrate. The high voltage supplied to the first and third electrodes may be of different magnitude to that applied to the first and second electrodes. Additionally, or alternatively, if the high voltage is repeatedly applied then it may be applied at a different frequency to the frequency of application to the first and second electrodes.

It will be appreciated that fourth or further electrodes may also be provided. Accordingly, a portion of the substrate to be treated may be arranged to pass between the first electrode and a fourth (and possibly further) electrode and a high voltage may be applied between the first and fourth electrodes so as to generate a plasma between these electrodes which treats the substrate. The high voltage supplied to the first and fourth electrodes may be of different magnitude to that applied to the first and second electrodes and/or may be different to that applied to the first and third electrodes. Additionally, or alternatively, if the high voltage is repeatedly applied then it may be applied at a different frequency to the frequency of application to the first and second electrodes and/or a different frequency to the frequency of application to the first and third electrodes.

Any one or more of the above electrodes may be made from steel, stainless steel, aluminium or any suitable conductor. Any one or more of the above mentioned electrodes may be electrically insulated. Preferably, the first electrode serves as the grounded electrode. Alternatively, bias voltages are used to generate the plasma, e.g. a bias voltage may be applied to the first electrode.

As mentioned above, a gas is preferably present between the electrodes so as to generate the plasma when the potential difference is applied across the electrodes. The gas may be from a single gas supply or may be a mixture of different types of gases from different gas supplies. For example, the gas may consist of only air, it may be a mixture of air and one or more other gases from another gas supply, it may consist of only a gas other than air; or it may consist of a mixture of different gases other than air. One or more of the gases may comprise at least one type of liquid in vapour form and the liquid vapour may be carried to the substrate surface in any of the aforementioned delivery configurations by a carrier gas.

The gas or liquid vapour preferably includes chemicals which treat the substrate when the plasma is generated. For example, the gas or liquid vapour may include functional chemicals (e.g. allylamine) for modifying the substrate surface in a manner that includes chemical functionalities when exposed to the plasma. The gas or liquid vapour may include monomers or oligomers (e.g. polyethylene glycol) suited to deposition and/or grafting and/or polymerisation on the substrate when it is exposed to the plasma. In the subsequent text, reference to gases or gas mixtures includes those that might be provided by inclusion of liquid vapours.

The gas pressure in the region where the plasma is generated is preferably at or about atmospheric pressure, although gases at other pressures are contemplated for use in the present invention.

Preferably, the gas is delivered into the gap between the electrodes. The method preferably provides a means of controlling the flow rate of one or more gases into the space between the electrodes. Preferably, a plurality of different gases from different gas sources are caused to flow into the space at different flow rates so that a gas mixture is present between the electrodes which preferably has different concentrations of said different gases. The flow rates may be controlled so as to provide the desired percentage concentrations of each of the different gases in the gas mixture between the electrodes. This may be done in tandem with the use of specific forms of delivery described above.

A plurality of gas flow controllers operating with different flow rates may be provided for delivering gases into the space between the electrodes. Gas supplies for different types of gases may be connected to each of said gas flow controllers, each gas supply preferably being connected to one of the flow controllers by a suitable valve. The valves may then be selectively opened and closed so that a single type of gas may be selectively supplied to the gap between the electrodes. Alternatively, the valves may then be selectively opened and closed so that combinations of two or more different gases may be delivered into the space between the electrodes.

Each of the one or more different types of gases may be supplied to the plurality of the flow controllers operating at different flow rates. As such, the valves may be selectively opened and closed to select the flow controller which supplies any given type of gas to the gap between the electrodes. The flow rate of each type of gas can therefore be controlled.

The valves may be controlled manually using a control unit or automatically via a computer interface via software. In one embodiment four flow controllers are provided for delivering gases at different rates. Gas supplies of four different types of gas are connected to each of four flow controllers. A solenoid valve is provided between each of the four source gas lines and each of the four flow controllers, such that four valves control the input to each of the individual four flow controllers. Each valve may be selectively opened or closed so as to allow any one of the different source gases to be delivered at a predetermined flow rate. This provides the functionality to subsequently combine the flows and produce gas mixtures across a very large concentration range. Alternatively different flows may be delivered to the electrode region via separate channels. The number of flow controllers, source gases and associated valves may be scaled up as necessary.

A gas distributor is preferably provided for supplying gas to the space between the electrodes. When different gases are introduced into the space between the electrodes they may be introduced via different flow paths. A gas distributor may be provided which is configured so as to provide and control flows of different gases into the gap between the electrodes in close proximity to each other. Alternatively, a plurality of different gas flows may be connected to a common input line that provides the gases as a mixture into the space between the electrodes.

The single gas or mixture of gases may be supplied uniformly into the space between the electrodes in which the plasma is generated. This may be achieved, for example, by using a gas distributor having a slot or nozzle for supplying the gas or mixture of gases uniformly into the space between the electrodes.

By varying the flow of gas or gases between the electrodes it is possible to vary the plasma conditions or to otherwise vary the concentrations of one or more gases and therefore to vary the substrate treatment leading to modification. Accordingly, the gas or mixture of gases may be supplied non-uniformly into the space between the electrodes in which the plasma is generated. For example, the gas or mixture of gases may be supplied at a plurality of loci between the electrodes. This may be achieved by supplying the gas or gases through a plurality of apertures. The apertures may be the same size or different sizes.

Additionally, or alternatively, the flow rate of the gas or mixture of gases into the space between the electrodes may vary across the substrate to be treated. As such, a higher flow rate may be provided between the electrodes in one region and a lower flow rate provided between the electrodes in another region. The variation in flow rate across the substrate to be treated may be continuous or gradual, or it may include one or more step changes in the flow rate. The variation in gas flow may be selected in a way so as to provide defined localised changes on the substrate to be treated. The gas or gases may be supplied to the space between the electrodes via a plurality of apertures which are of different sizes so as to provide different flow rates through them with attendant effects on the associated plasma conditions and thereby modification.

In addition, or as an alternative to varying the flow rates of the gas or gases spatially across the substrate, the flow rate of the gas or gas mixtures may be varied with time. Additionally, or alternatively, the direction of the gas flow may be varied during the plasma treatment or between successive plasma treatments so as to provide a variation in plasma conditions.

Preferably, a gas is supplied to the region between the electrodes in order to purge this region of other gases prior to the plasma treatment. This purge gas may be the same or different to the gas or gases that are present when the plasma is generated by applying a potential difference to the electrodes. The purge gas may be supplied so as to cover the entire substrate to be treated or so as to primarily occupy the region between the electrodes. The electrodes and substrate are preferably housed in a chamber or other enclosure and the purge gas may be used to purge the entire chamber of other gases prior to the plasma treatment. Alternatively, the purge gas may be controlled so as to blanket the substrate to be treated in order to provide a barrier between the substrate and other gases. In this configuration the requirement for purging the entire chamber prior to sample treatment may be negated.

As has been described above, the second electrode may provide directly for the gas distribution, wherein the second electrode has vents, apertures or slots so as to allow gas or gases to pass out of the electrode. Alternatively, the gas distributor may be provided as a separate member to the electrodes. This separate member may be slotted or apertured or have vents to allow for the gas flows as described above. It is also contemplated that both the second electrode and one or more separate members may act as combined gas distributors. For example, one of the gas distributors may supply gas for use in purging and another gas distributor may be used for supplying gas for use to modify the substrate during the plasma treatment process.

Both the high voltage applied to the electrodes and/or the gas flow to the gap between the electrodes may be controlled based on feedback mechanisms. These feedback mechanisms may detect electrical characteristics of the discharge between the electrodes, detect spectroscopic properties of the discharge between the electrodes; or may analyse the gases present between the electrodes (e.g. before, during or after the plasma treatment).

As described above, the electrodes and substrate are preferably arranged within a chamber or enclosure. The substrate is preferably rotatably supported by one or more members which may be moved by magnetic fields. A magnetic drive unit may be provided for generating magnetic fields that rotate the support member so as to then rotate the substrate about the axis. The magnetic drive unit is preferably arranged outside of the chamber and the magnetic field passes through the chamber wall(s) and drives rotation of the support member and therefore drives rotation of the substrate. Preferably the support member is the rotatable platen described above. Alternatively, the second electrode may be rotated about said axis and the magnetic drive may move the second electrode.

As described above, a rotating platen which comprises the first electrode is preferably used to rotate the substrate. The system is designed so that the platen accepts a tray that is used to hold the substrate to be treated. The tray is preferably in a form such that the substrate can be clamped or otherwise fixed securely to it. This tray provides for the rapid exchange of substrates and protects the substrate from any adverse interaction with the underlying platen, which may be covered by an electrical insulator. This also renders possible automated substrate exchange between a loading chamber and the plasma treatment chamber or enclosure easier. The use of a cleanable tray or tray with a replaceable base material for each consecutive run also eliminates the effects of contamination created by previous substrate treatment runs. The nature of the tray also enables the substrate to be easily pre-treated or post-treated by processes such as hot-embossing or vacuum forming. The frame of the tray may also act as container sidewalls in subsequent processes requiring liquid coverage of the substrate.

The plasma treatment of the present invention may be used to alter the surface chemistry, topography, or morphology of the substrate surface either directly or by using it in combination with a chemical compound for the purposes of adding additional chemical species the surface via grafting or polymerisation. For example, the treatment may change the chemical composition or the roughness of the uppermost region of the substrate surface or may provide for a chemical compound placed on the surface to be tethered to it. According to one example, a polystyrene substrate was processed by a plasma generated in the presence of air and the substrate showed a Ra surface roughness change from 1.19 nm to 2.10 nm. As has been described above, various methods may be used in the process to change the chemistry, topography, or morphology across the substrate surface by varying degrees. Any one or combination of two or more of the following may be used to vary the degree of treatment across the substrate; varying the gas flow between the electrodes spatially and/or temporally; varying the spacing between the electrodes spatially and/or temporally; varying the speed or rotation of the substrate between the electrodes; varying the current and/or potential difference applied to the electrodes; and varying the frequency at which the current and/or potential difference is applied to the electrodes.

The substrate may be loaded with biological or non-biological molecules at specific locations on the substrate which, when subjected to the plasma treatment induces grafting or polymerisation or otherwise augments the surface chemistry, morphology or topography of the substrate.

Preferably, the plasma treatment may increase the roughness of the substrate surface by providing a gas between the electrodes and applying a potential difference to the electrodes capable of providing an ablative treatment to the substrate.

Preferably, chemical functionalities may be grafted to the substrate by providing a gas between the electrodes and applying a potential difference to the electrodes such that the plasma effects grafting of the chemical functionalities to the substrate. A liquid or gel may be provided to coat the surface of the substrate with the chemical compound prior to grafting chemical functionalities to the substrate. Additionally, or alternatively, the substrate may be placed on a holder (e.g. a film) having elements and or the chemical functionalities to be transferred to the substrate, and wherein both the substrate and substrate holder are subjected to the plasma so as to transfer some or all of the chemical moieties to the substrate surface during the process.

The plasma treatment may homogeneously or non-homogeneously deposit monomers and/or oligomers on the substrate surface. Additionally, or alternatively, the plasma treatment may homogeneously or non-homogeneously polymerise monomers and/or oligomers on the substrate surface.

Preferably, the substrate may be treated using the plasma and then moved relative to the axis of rotation so that the substrate is rotated about a different point on the substrate. The plasma may then treat the same portion of the substrate for a second time. This approach may be used to create bands having different levels of treatment.

It will be appreciated that any two or more of the above types of plasma treatment may be performed on the same substrate. The treatments may be performed as subsequent processes or may occur simultaneously. When the processes occur simultaneously the gas or gas mixture between the electrodes is selected so as to allow the multiple processes to occur in a concerted way.

It will be appreciated that the present invention may be used to alter the chemistry, topography, or morphology of the substrate to a specific range of depth below the substrate surface. For example, the substrate may be modified up to a depth of at least 5 nanometers, at least at least 10 nanometers, at least 20 nanometers, at least 40 nanometers, at least 60 nanometers, or at least 120 nanometers. The depth to which the substrate is altered may be different in different regions of the substrate.

Any one or combination of two or more of the following may be varied in order to vary the treatment depth across the substrate; varying the gas flow between the electrodes spatially and/or temporally; varying the spacing between the electrodes spatially and/or temporally; varying the speed or rotation of the substrate between the electrodes; varying the current and/or potential difference applied to the electrodes; and varying the frequency at which the potential difference is applied to the electrodes.

Preferably, the substrate may have been pre-processed prior to being treated with the plasma. The pre-treatment may be via a process commonly known in the areas of surface science and engineering. For example, the substrate may be pre-processed by processes such as but not limited to embossing, vacuum forming, lithography, injection moulding, sputtering, chemical treatment (e.g. using silane derivatives), laser ablation, dip coating, spin coating, ion beam etching, punching, cutting, mounting, adhering, welding, mechanically fixing or housing in substrate carriers.

Preferably, after the plasma treatment the substrate produced may be further processed via processes commonly known in the areas of surface science and engineering. For example, the substrate may be processed by processes such as but not limited to embossing, vacuum forming, lithography, sputtering, chemical treatment (e.g. using silane derivatives), laser ablation, dip coating, spin coating, ion beam etching, punching, cutting, mounting, adhering, welding, mechanically fixing or housing in substrate carriers.

The present invention also provides a system for performing the above method(s). Accordingly, the present invention also provides a system as claimed in claim 30.

The system may include any one or combination of the features of the method described above. For example, the support mechanism may comprise a rotatable platen on which the substrate is mounted in use and wherein only part of the platen passes between the electrodes at any given time.

As described above, the inventors have recognised that varying the spacing between the first and second electrodes dynamically throughout processing may be useful in controlling the plasma conditions. This concept is believed to be an invention in its own right. Accordingly, from a second aspect, the present invention also provides a method of modifying a substrate as claimed in claim 32.

Any one or combination of the features described above in relation to the first aspect of the invention may be preferred features of this second aspect of the invention. The invention also provides a system for performing the method according to the second aspect of the invention.

As described above, the inventors have recognised that providing a non-uniform gas flow between the electrodes may be useful in controlling the plasma conditions. This concept is believed to be an invention in its own right. Accordingly, from a third aspect the present invention provides a method of modifying a substrate as claimed in claim 33.

Any one or combination of the features described above in relation to the first aspect of the invention may be preferred features of this third aspect of the invention. For example, the gas may be supplied to the region between the electrode and the substrate through a plurality of apertures and the gas may have different flow rates through different apertures. The invention also provides a system for performing the method according to the third aspect of the invention.

As described above, the inventors have recognised that supplying the gas from a conduit in proximity to the electrodes to the region between the electrodes may be useful. This concept is believed to be an invention in its own right. Accordingly, from a fourth aspect the present invention provides a method of modifying a substrate using a plasma.

Any one or combination of the features described above in relation to the first aspect of the invention may be preferred features of this fourth aspect of the invention. The invention also provides a system for performing the method according to the fourth aspect of the invention.

As described above, the inventors have recognised that rotating the substrate using a magnetic drive may be useful. This concept is believed to be an invention in its own right. Accordingly, from a fifth aspect the present invention provides a method of rotating a substrate in a substrate treatment chamber.

Any one or combination of the features described above in relation to the first aspect of the invention may be preferred features of this fifth aspect of the invention. For example, the mechanism may support the substrate in a rotatable manner and the magnetic field rotates the mechanism and the substrate. The invention also provides a system for performing the method according to the fifth aspect of the invention.

BRIEF DESCRIPTION OF THE DRAWINGS

Various embodiments of the present invention will now be described, by way of example only, and with reference to the drawings, in which.

SPECIFIC DESCRIPTION

Figure 1:
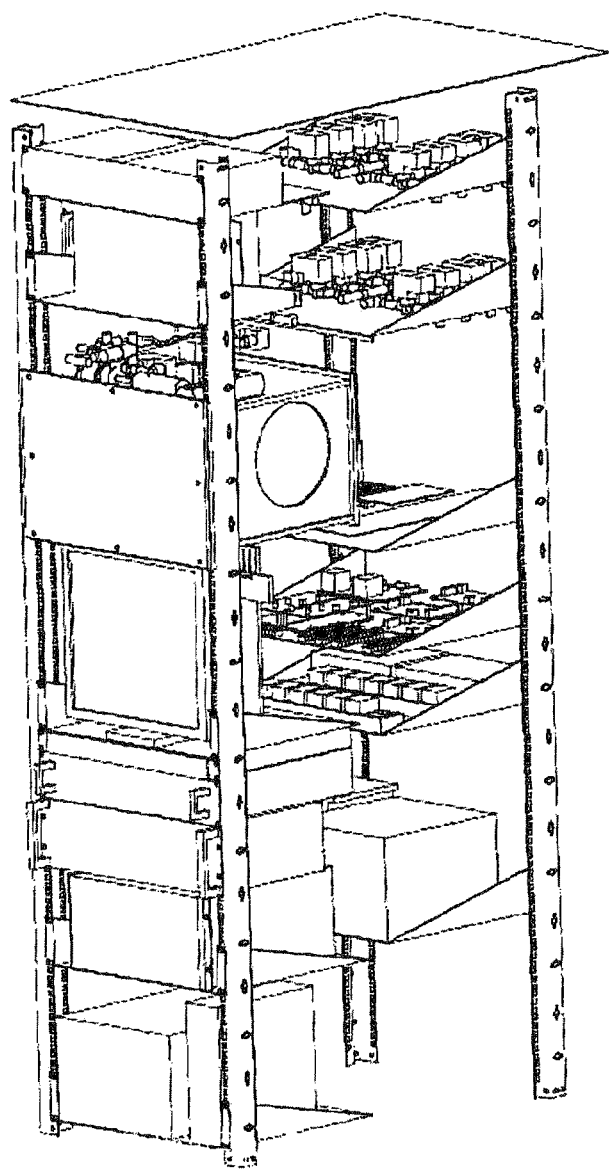
FIG. 1 shows a schematic of an apparatus according to a preferred embodiment.

FIG. 1 shows a schematic of an apparatus according to a possible embodiment of the invention.

Figure 2:
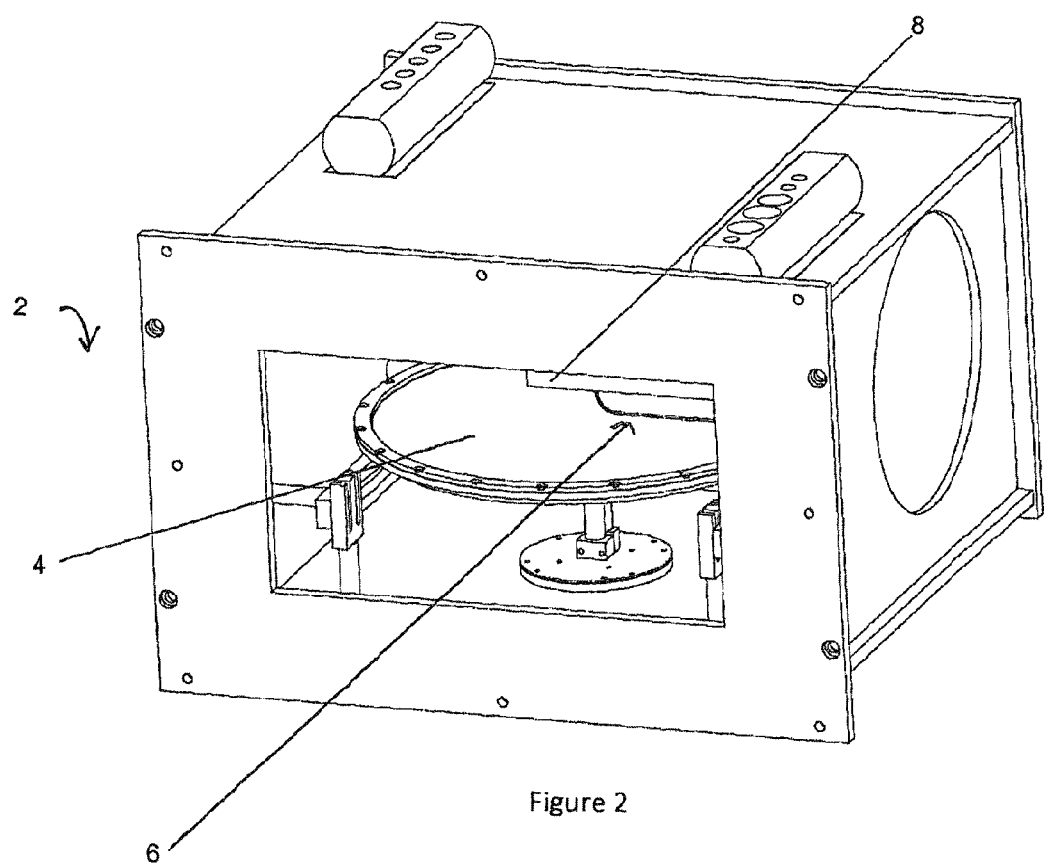
FIG. 2 shows an embodiment of an atmospheric pressure plasma reaction chamber.

FIG. 2 shows an embodiment of an atmospheric pressure plasma reactor chamber 2. The chamber houses a rotatable platen (4), which acts as a ground electrode, and a wire electrode (6) arranged at a distance above the platen. The wire electrode is positioned in line with the radius of the rotating platen. A gas distributor (8) is provided to supply gas to the space between the two electrodes (4,6) for use in generating the plasma. In use, a substrate is mounted on the rotatable platen such that it is in the gap between the two electrodes and the substrate is then rotated by rotating the platen. A high voltage is applied between the platen electrode and the wire electrode so as to generate a plasma discharge between the electrodes.

This arrangement produces a variation in the speed of transit of the substrate through the discharge region of the generated form of plasma, wherein the speed of transit varies along the radius of the platen. This variation in speed is directly related to the displacement from the axis of rotation and results in an associated gradient in the energy dose and power density applied to substrate which is mounted on the platen.

The present invention provides a novel and inventive way in which the conditions between the electrodes comprise those required for creation and control of a plasma with a dielectric barrier discharge plasma shown as an example. In dielectric barrier discharge, the key elements are the electrodes, the characteristics of the electrical discharge created in the form of micro-streamers (or glow under suitable conditions) and the composition of the gas that makes up the dielectric gap between the electrodes. The actual plasma conditions are largely determined by the dielectric properties which is a consequence of the nature of the gas (air or other gas) that the discharge passes through.

Figure 14:
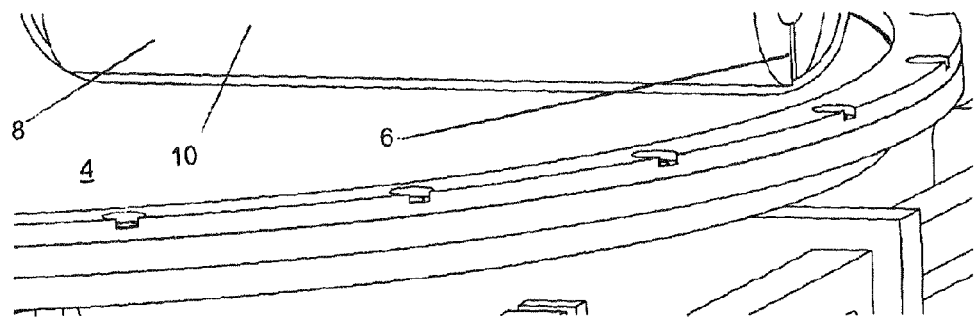
FIG. 14 shows an embodiment of a gas distributor arrangement.

In the dielectric barrier discharge systems used heretofore, the gas is provided uniformly to the discharge region. The provision of a non-uniform gas distribution as a means of creating enhanced or otherwise unique dielectric barrier discharge operating conditions that can engender well defined localised changes in surface chemistry and/or topography are part of the invention reported herein. A preferred embodiment provides a processing system that combines a unique form of distributed gas (air or other gas) delivery to the electrode gap and rotation of the substrate under specific speed and angular conditions. In essence, the gas (air or other gas) is presented to the working electrode (wire electrode) via exit points along its length that produce loci of increased flow dependent on the location of the point of injection relative to the rotational arc of travel of the substrate relative to the working electrode. FIG. 14 shows an embodiment wherein a gas distributor (8) is arranged above the wire working electrode (6) which includes a plurality of channels (10) for supplying gas at discrete loci. This arrangement changes the plasma conditions across the length of the wire electrode in a manner that provides for associated localised variations in the excited species created in these regions and hence varies the degree to which the surface modification occurs in regions proximal to these points.

Gas flow from the injection points is affected by the transition of the grounded electrode (platen) passing through the direction of flow of the gas exiting from the distributor above the wire electrode. Across the radius of the working electrode where the sample sits, a displacement of the localised dielectric barrier discharge operational conditions is produced at a rate that increases exponentially. Drag on the gas by the rotational movement of the substrate/platen assembly will then affect the gas flow behaviour in the direction of rotation. As a result, the gas that is driven in the direction of rotation will be subject to a proportional centrifugal force acting radially outwards from the centre and in close proximity to the substrate surface. The combination of speed of gas flow from the distributor and the speed of rotation of the platen can then be used to provide transitions between laminar and turbulent flow. As such, both the speed of the platen and the configuration of the inlet gas distribution can be used to control gas flow and concentration at the regions of specific surface loci indicated above. This results in significant variations in the degree of excitation of the chemical species known to occur in dielectric barrier discharge and hence has an associated impact on modification of the surface of the substrate.

Figure 15:
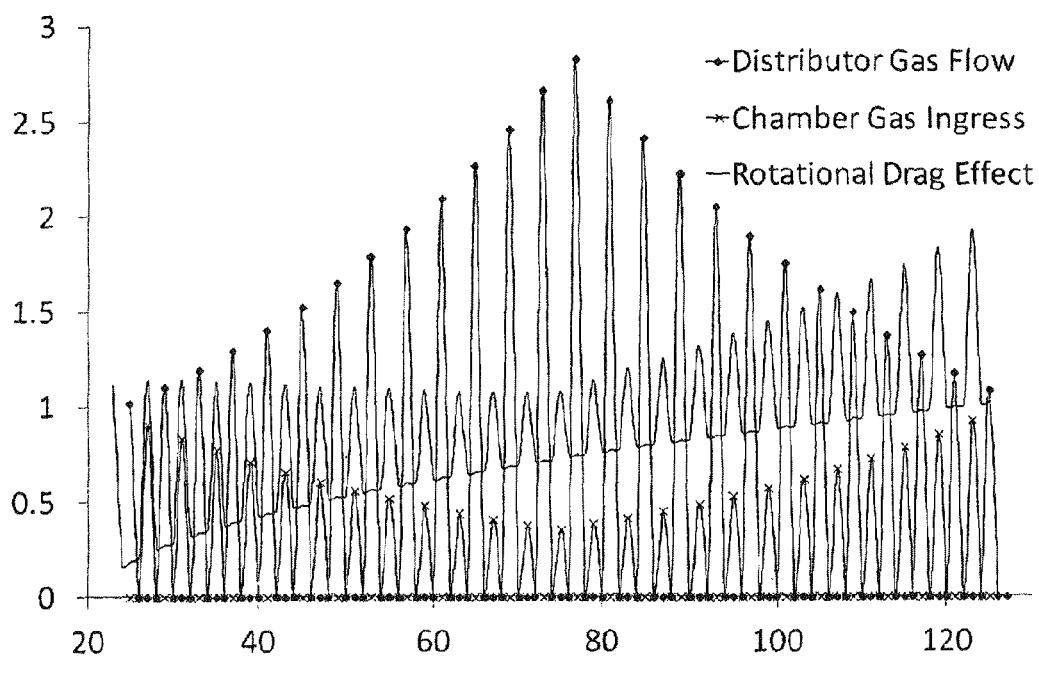
FIG. 15 shows various gas flows over the substrate radius.

FIG. 15 shows three plots depicting an example of the variation in gas flow from the distributor, the variation in ingress of in situ chamber gas and the effect of variation of rotational drag (all of which occur in the discharge region between the electrodes) as a function of the radial distance (in mm) away from the axis of rotation (x-axis).

Additionally, an increase in radial displacement of the substrate through the discharge region results in an exponential decrease in the plasma energy dose experienced by the substrate across the electrode length from the centre of rotation outwards, thereby creating an associated per unit surface area reduction in the concentrations of the excited species that interact with the substrate thereby influencing the resulting degree of substrate modification.

Figure 16:
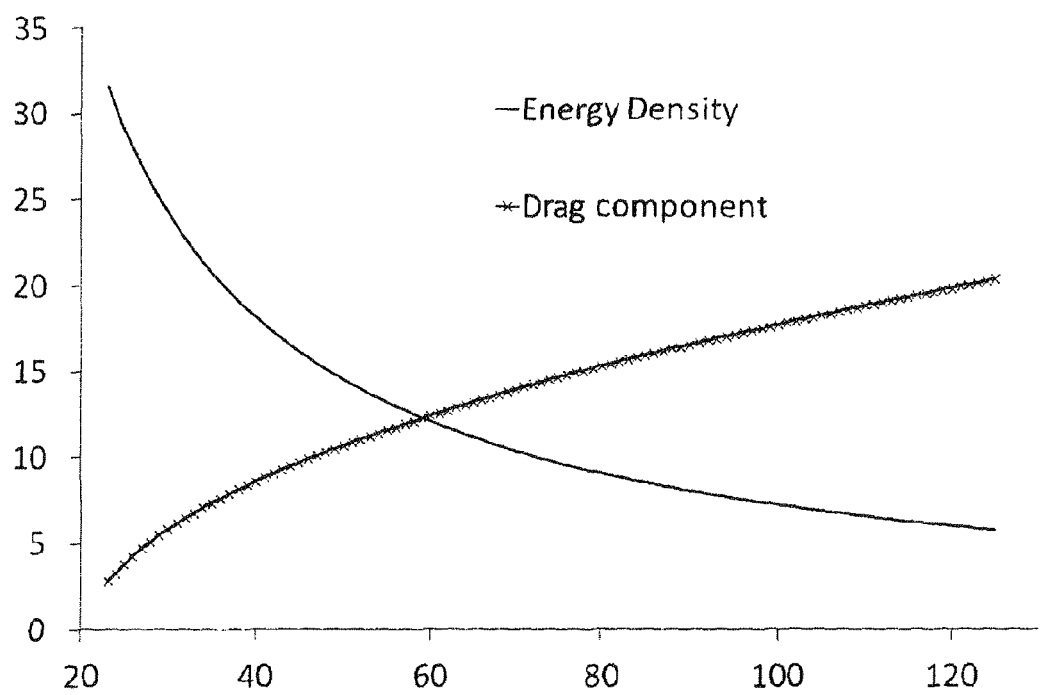
FIG. 16 shows how the plasma energy density and drag component of the gas between the electrodes may vary over the radius of the substrate.

FIG. 16 shows two plots indicating how the energy density and drag component (in the discharge region between the electrodes) vary as a function of the radial distance away from the axis of rotation (x-axis).

Through a controlled combination of these factors, gradated chemical and topographical changes across the substrate surface can be created.

The platen may be rotatably driven by magnetic drives through the chamber walls. The drive motor position may be fed back to control software using an angular encoder. The angular encoder may be used to indicate the rotational position of the platen under the wire electrode.

The high voltage actuation may be controlled/triggered via software such that it is made to occur within a certain sector of the platen having a specific size (the equivalent of slicing a cake into sectors of desired size).

Software may be further used to control any one or more of the following: the speed of rotation of the platen, the intensity/power produced in the discharge or the number of cycles (repetitions) of discharge occurring in a specified sector of the platen. This can be used to treat substrates placed on the same platen with various parameters according to the operator's requirements in terms of power, speed and number of cycles. The method can be controlled so that the treatment in a selected region is the same at points on the substrate having the same radial distance from the axis of rotation (and within a given sector that has been treated under the same control parameters). The gradient of treatment occurs along the radius of the rotating platen. However, it will be appreciated that the electrode may be shaped and arranged in any orientation between the centre and outer edge of the platen in order to create a desired energy density gradient and thereby matched to a pattern of modification on the substrate surface.

A rotary encoder may be used to provide a value for the angular position of the platen and hence of the substrate. Feedback from the rotary encoder may be used to provide the information required to allow computer controlled variation of the power through the angular rotation in any treatment sector. This can provide a further variation in the degree of substrate treatment in the direction of rotation. The substrate may therefore be provided with a two-dimensional gradient in surface treatment, i.e. a gradient in the circumferential direction coupled with a gradient in the radial direction.

The provision of variation in the discharge power delivered to specific areas of the substrate surface through angular rotation can also encompass controlled surface treatment gradients in three dimensions (3D), where the effect of the treatment in the third dimension (i.e. depth into the sample surface) is measured on a scale of nanometers. Alternatively, it may be coupled with a layer-by-layer fabrication methodology such that treatment of each layer results in a 3D structure with the required properties included.

It is also contemplated herein that the discharge behaviour may be controlled via feedback mechanisms. For example, the control may be based on feedback from the analysis of electrical characteristics of the discharge, feedback from the spectroscopic properties of the discharge, or feedback based on the analysis gases during or after the plasma treatment.

The electrode assembly may be configured in a way so as to achieve effective masking of the discharge in specified zones of the substrate in order to achieve localised or varied treatment in such specific regions.

The preferred embodiment has the capacity to control the discharge so as to operate in various gas and gas mixture environments. This may provide the facility to produce layered treatment effects on the substrate surface indicated above. For example, a surface roughness may be induced via treatment using selected gas mixtures and discharge parameters suited to deliver an ablative treatment effect. Likewise, chemical functionalities may be grafted to the surface in succession using selected gas/vapour and surface liquid/gel mixtures and appropriate discharge parameters. Further ablative treatment may then be used to expose chemistries and appropriate surface roughness. It is typical with atmospheric pressure plasma treated surfaces for ageing to affect the chemical functionality and related properties such as wettability. As such, further functions of the substrate surface character would relate to the time elapsed since processing.

Figure 3:
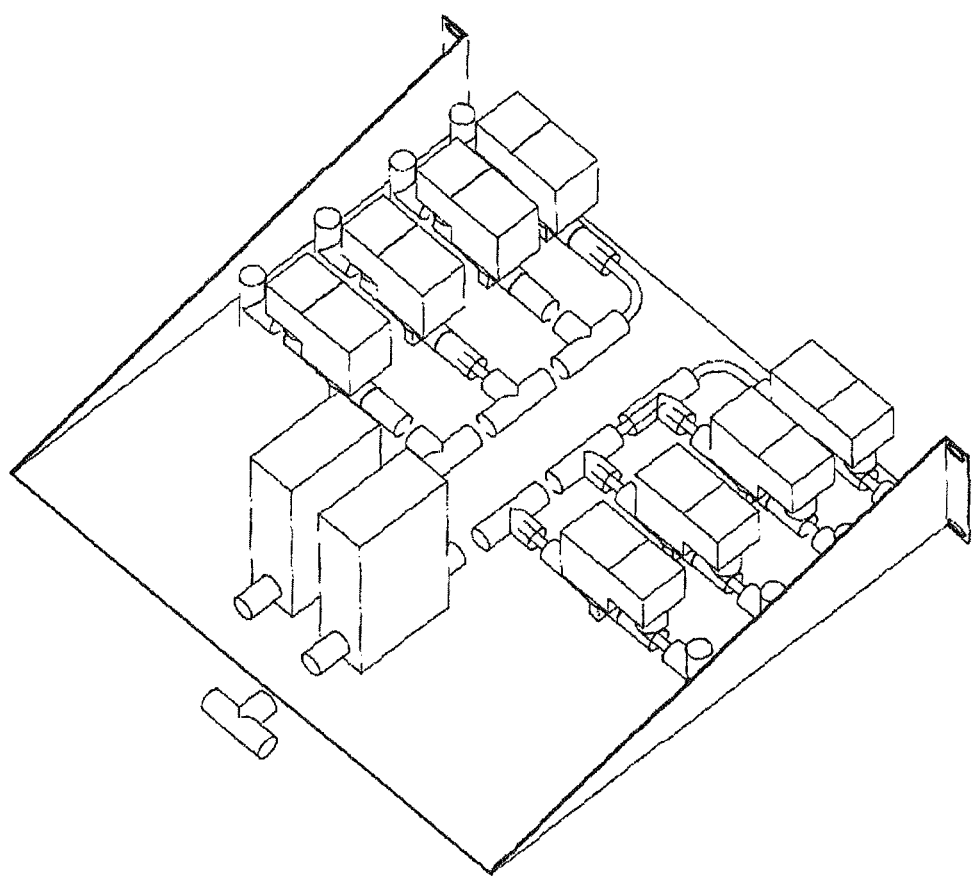
FIG. 3 shows an embodiment of the gas source control.

The preferred embodiment controls the flow of a gas or gas mixtures into the discharge region. FIG. 3 shows a form of gas control mechanism that can be used with a preferred embodiment. The gas flow is controlled using mass flow controllers. Each mass flow controller operates in a different flow range (20 L/min, 5 L/min, 0.5 L/min, and 0.01 L/min) in order to provide for accurately controlled flow levels and therefore enables delivery of predetermined percentage concentrations of each gas in the final mixture. These mass flow controllers are connected via input lines to the discharge chamber. The mass flow controllers may be operated manually using a suitable control unit or automatically via an appropriate software routine. In the preferred embodiment four mass flow controllers are controlled by such control units. The line entering each mass flow controller has four solenoid valves controlled via manual switches, as shown in FIG. 3. These may also be controlled via computer software. This allows rapid switching of input gases to each of the mass flow controllers and thereby provides the functionality to produce gas mixtures across a very large concentration range. The gas is channeled to flow directly over the position of the working wire electrode but can also be directed to purge the chamber. With appropriate gas mixtures a glow discharge may be produced. The types of gases that can be used as well as combinations and ratios thereof are largely unlimited due to the use of a stainless steel and polytetrafluoroethylene (PTFE) based flow control design. Additionally, many liquids in vapour form may be carried to the discharge region using the same flow system using evaporation cells and carrier gases as necessary. This may include, but is not limited to, chemicals such as silanes, allylamine and other functional chemicals, monomers or oligomers (such as polyethylene glycol) suited to deposition and/or grafting or polymerisation.

In a further embodiment the gas flow conditions can be controlled to allow for blanketing of the entire surface of the platen in order to provide a barrier between the substrate and other chamber gases. In this configuration the requirement for chamber purging prior to sample treatment may be negated. The small surface area of the rotating platen motion is advantageous in this respect as compared to that used in a linear drive mechanism, which is required to traverse/operate over a much larger area.

Further electrodes may be fixed over the platen surface in order to allow discharges that operate with similar or different electrical conditions (e.g. frequency, voltage, current) to augment substrate surfaces as part of the overall substrate treatment regime.

The wire working electrode may be replaced by a porous electrode configuration capable of providing for the delivery of gas through this electrode directly to the plasma region. In less preferred embodiments, the electrode above the platen may take the form of a ball-tipped wire, a quartz tube or other electrodes. In the case of the ball tipped wire, provision may be made for movement of the electrode in order that it is able to traverse the radius of the platen. The use of a tray type assembly to hold the samples of any type on the treatment surface provides for the rapid exchange of samples between batches and protects the surface of the platen. The chuck or mechanism for holding the tray onto the platen electrode can be any suitable type, e.g. vacuum, magnetic, etc. that provides for simple manual or automated sample exchange. The nature of the tray may enable the substrate to be easily pre-treated or post-treated by processes such as hot-embossing or vacuum forming. The frames may also act as suitable container sidewalls in processing techniques requiring liquid coverage of the substrate surface. In the current embodiment, the tray is assembled using bolts, however a clamping mechanism based on snap fittings could improve processing efficiency and lend itself well to automated production runs.

As has been described above, by providing a high voltage plasma and varying substrate transit speed through the plasma region, varying gas concentration in the plasma region or varying gas flow control across the plasma region, controlled and repeatable changes in surface chemistry, topography, morphology of the substrate can be provided. The following drawings illustrate some of the changes in elemental composition of the surface of a model polypropylene (PP) film substrate that have been evidenced when processed on the system according to a preferred embodiment.

Figure 4:
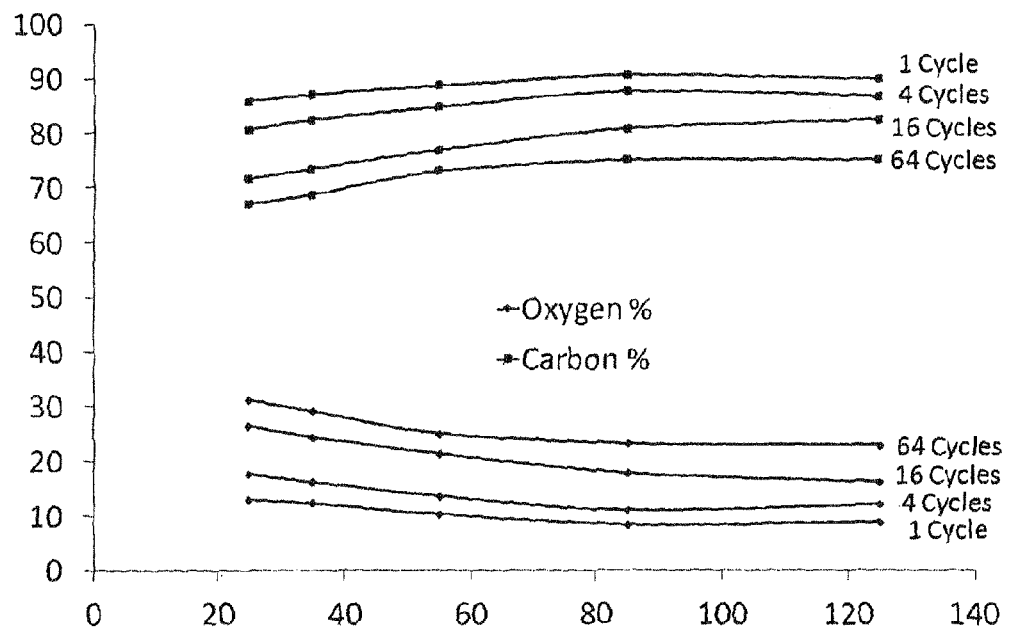
FIG. 4 shows data for a polypropylene substrate treated by the plasma process in the presence of air.

FIG. 4 shows data for PP substrates treated using the basic level processing conditions in air and with no induced gas flow at the electrode position. The x-axis represents the radial distance away from the axis of rotation of the platen (in millimeters) and the y-axis represents the percentage concentration of oxygen and nitrogen detected (as measured by X-ray photoelectron spectroscopy). The polypropylene was treated for 1, 4, 16 and 64 cycles at 140 W plasma power and a platen speed of 24 RPM to provide the chemistries shown. Note the general gradated change in the surface chemistry that results as a function of the position from the centre of rotation. Note also that the effects of the treatment at the inner and outer radial positions match reasonably as the number of cycles changes, due to the relatively similar plasma energy dose that the substrate is subjected to in each case.

Figure 5A:
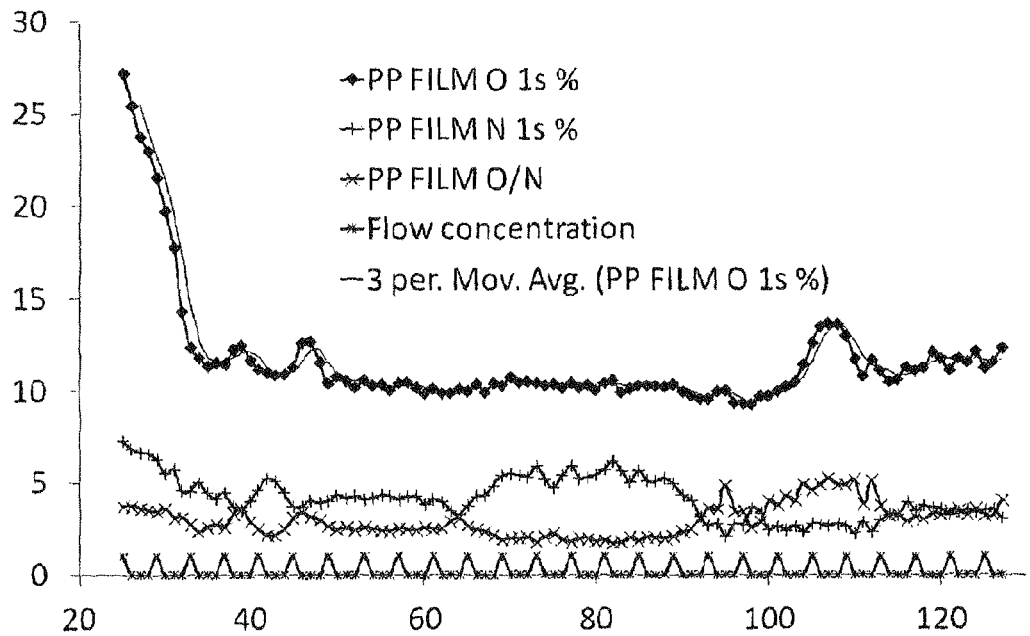
FIGS. 5A and 5B show the concentration of oxygen and nitrogen created on a modified substrate surface as a function distance along a strip on the substrate surface, when the plasma treatment has been performed using nitrogen gas.
Figure 5B:
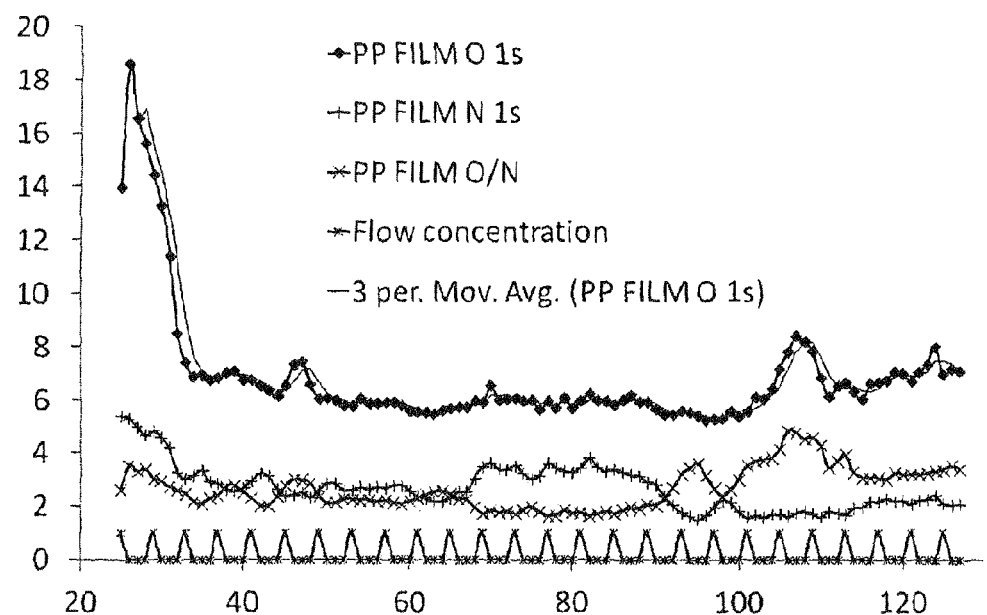
Figure 5C:
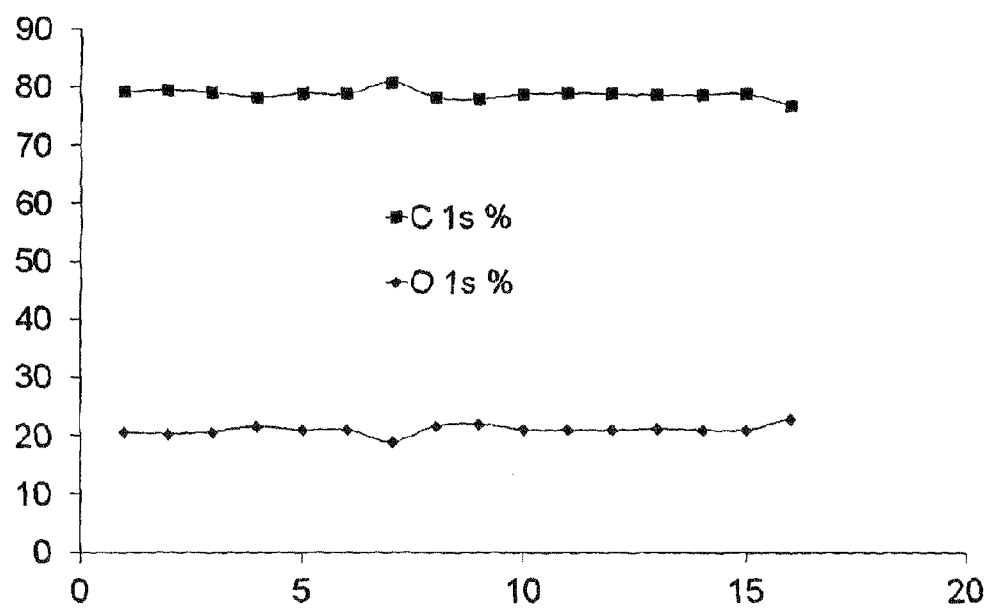
FIG. 5C shows concentration of oxygen and carbon on a modified substrate as a function of position along an arc of equal radius within an area of plasma treatment in air indicating consistency of condition.

FIGS. 5A and 5B show data from X-ray photoelectron spectroscopy (XPS) analysis carried out on polypropylene substrates treated using the process. The x-axis in each of the figures represents the radial distance along the substrate from the axis of rotation. In FIG. 5A, the y-axis represents the atomic concentration for nitrogen and oxygen detected on the substrate surface derived from quantification of peak area intensities using established computational techniques. In FIG. 5B, the y-axis represents the atomic concentration for nitrogen and oxygen on a sample substrate surface for XPS data derived from peak areas. FIG. 5C shows concentration of oxygen and carbon on a modified substrate as a function of position along an arc of equal radius within an area of plasma treatment in air indicating consistency of condition;

These figures show a number of important features that relate to the treatment of PP in a plasma discharge process described herein operating with nitrogen flowing through the gas distributor. Clearly, at smaller radial distances from the axis of rotation higher concentrations of both nitrogen and oxygen have been introduced into the substrate surface due to a higher energy dose from the plasma associated with this slower speed of rotation of the substrate. The concentrations of oxygen and nitrogen then drop exponentially with increased distance from the axis of rotation as a function of the relatively lower energy dose in the region. Moving outwards along the radial position on the x-axis, the nitrogen flow from the gas distributor becomes the dominant factor. The flow of nitrogen is highest, at the centre of the x-axis such that the oxygen to nitrogen ratio is lowest. As oxygen is push out from the central region it accumulates and is introduced to the substrate surface in the plasma at regions at 38, 46 and 108 mm. Whilst the oxygen concentrations may be similar in these regions, the nitrogen concentrations differ, for example between 46 and 108 mm. Therefore, by carefully controlling the flow of the gases and using a substrate transit speed gradient in the plasma region, the substrate surface changes can be tailored in a specific way. These changes are manifest in both the XPS peak area and peak intensity data derived datasets for treated PP. Note also the localised changes in nitrogen concentration on the surface associated with increased localised gas flow concentrations, especially in the central region of the discharge zone where the overall nitrogen flow is higher.

Figure 6:
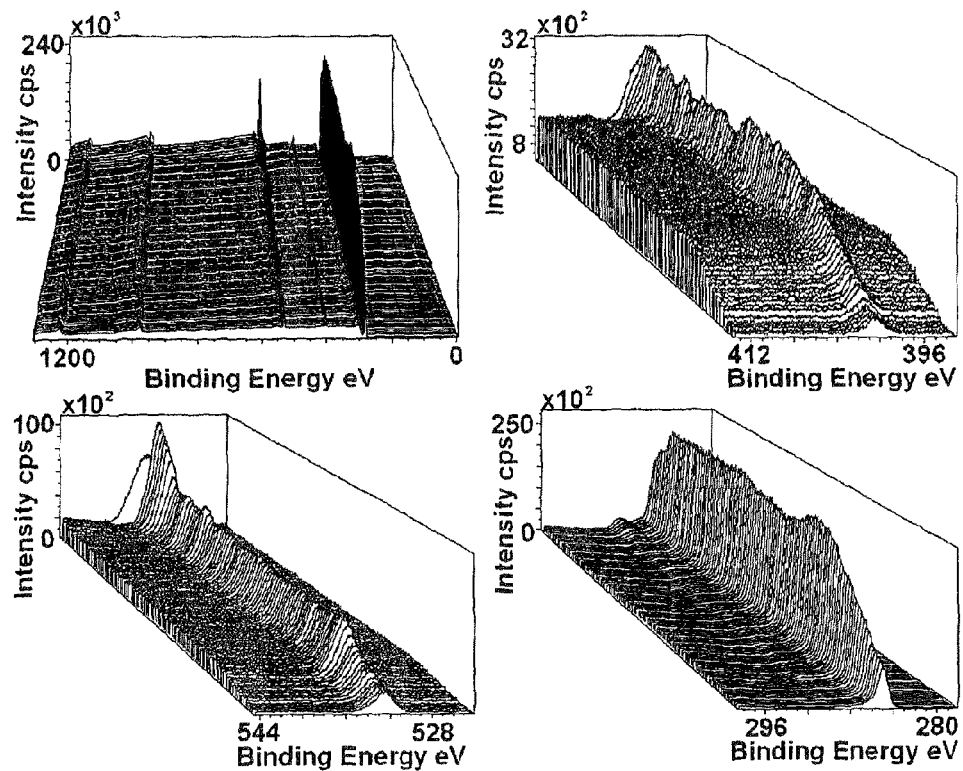
FIG. 6 shows stacked X-ray photoelectron spectroscopy data for plasma treatments using a nitrogen gas.

FIG. 6 shows an examples of stacked XPS scans for the nitrogen based treatment which confirm the differences in the surface treatment as a function of distance along the length of the substrate surface.

Figure 7:
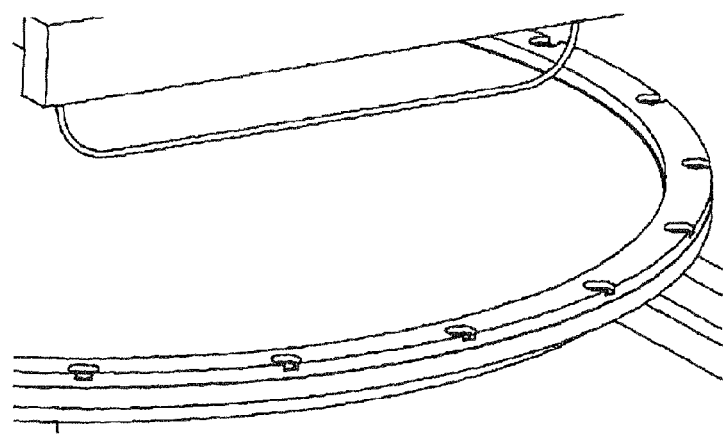
FIG. 7 shows an example of an embodiment of a gas distributor and electrode arrangement.

FIG. 7 shows a photograph of the atmospheric pressure plasma "sheath" of microstreamers produced in the region above the substrate during treatment.

Figure 8:
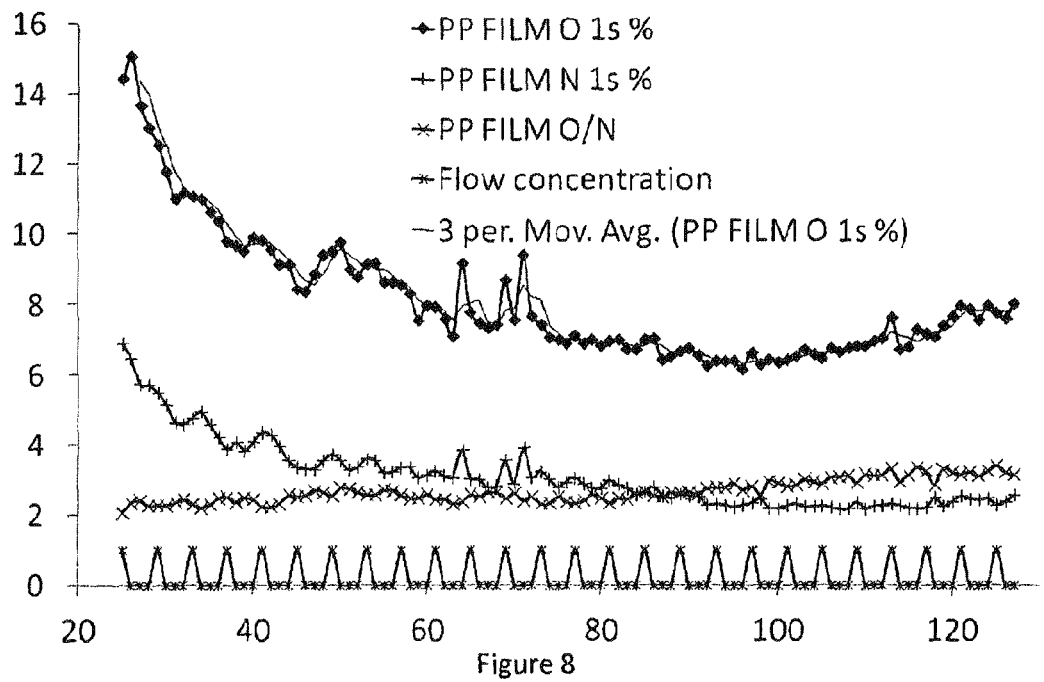
FIG. 8 shows the concentration of oxygen and nitrogen on a substrate surface as a function of the position on the substrate surface, when the plasma treatment has been performed using a nitrogen and ammonia gas mixture.

FIG. 8 is shows the XPS derived data for a treatment that uses an ammonia and nitrogen blend gas operating under a processing configuration similar to that used to create the plots for 5A and 5B.

Again, the x-axis represents the radial distance along the substrate from the axis of rotation and the y-axis represents the atomic concentration values calculated for nitrogen and oxygen on a sample substrate surface post treatment.

In the ammonia-nitrogen blend treatment, the oxygen is not displaced from the central region in the same manner as was the case for processing with nitrogen alone since the variations in nitrogen and oxygen content follow the same trends. However, the oxygen to nitrogen ratios shows that this relationship is not entirely directly proportional over the range.

FIG. 8 (along with FIG. 5A/B) illustrates the benefits of using localised variations in gas flow to create localised gradients in chemical concentrations and plasma conditions at the substrate surface.

Figure 10:
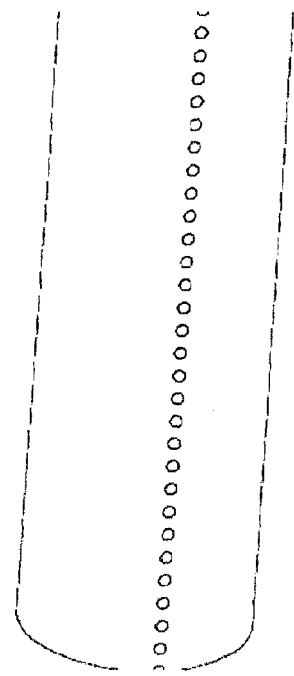
FIG. 10 shows an embodiment of a gas distributor for supplying gas between the electrodes.

FIG. 10 shows a form of gas distributor comprising a hollow tube for carrying the gas with a plurality of apertures in the tube. The apertures deliver the gas to the substrate surface in the plasma discharge region at loci adjacent to the position of the holes, thus providing localised gas flow at a plurality of points along the substrate surface. This arrangement permits the combined effects of energy dose and gas flow/concentration to be exercised in the same plane. FIG. 10 depicts one embodiment of a gas distributor, although it is noted that other types of localised flow control mechanism may be used.

Figure 9:
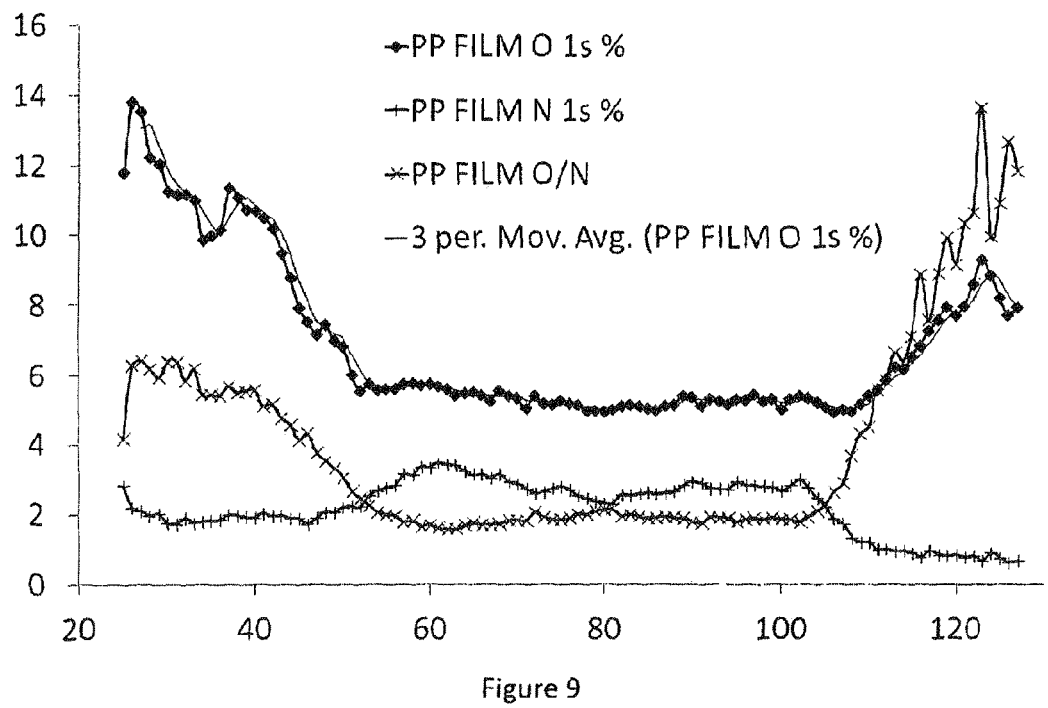
FIG. 9 shows the concentration of oxygen and nitrogen on a substrate surface as a function of the position on the substrate surface, when the plasma treatment has been performed with a different gas flow distribution to that used to generate the data in FIGS. 5A and 5B.

FIG. 9 shows the effects of using a gas distributor which is designed to produce less localised gas flow variations for processing polypropylene substrates using the process. FIG. 9 illustrates that by adjusting the dynamics of the flow over the wire electrode to be less localised changes in the composition of surface chemistry across this same plane can be realised. For this configuration, the nitrogen flow was provided using a slot type gas distributor, as opposed to the array of holes used to obtain the data shown in FIG. 10.

The data provided in the various figures is evidence that the combination of a gradient power distribution and distribution of gas flow in the discharge region produces repeatable changes in substrate surface chemistry that varies along its length. The changes induced typically extend approximately on the nanometer scale into the substrate surface using this process. Thus, the process generally does not adversely affect the bulk properties of the substrate, unless this is a desired outcome and the process is controlled so as to achieve this, e.g. in plasma polymerisation. Likewise, conditions can be created that vary the surface roughness across the length of the substrate post-processing during one step.

The present invention is not limited to the electrode and chamber/enclosure dimensions, gases, flow rates, flow distribution dynamics, power levels, or cycle numbers provided in the examples above and this data provides only examples of the potential surface outputs in terms of chemical concentrations and production of surface gradient effects. In addition to changing the overall chemical composition, the type and nature of surface chemical bonds involved can be controlled using the system. Determination of the subtle changes surface properties that occur over the macro-scale, can provide useful data to predict subsequent interfacial responses.

The present invention enables a number of ways to control substrate modification.

The region in which the discharge occurs may be accurately controlled to provide variation in discharge power, distribution and number of treatment cycles.

The discharge power may be continuously or discontinuously changed over time throughout a specific region or in a number of different regions.

The methods by which gas is made to flow through the discharge region may be adapted to provide both gradual gradients of flow across the substrate or to create step changes in flow at specified locations.

The gas distributor may be designed in such as way as to provide for flows of different types of gases in close proximity to each other.

The plasma reactor chamber may be an enclosed chamber which can be stand alone or integrated with a given manufacturing/treatment process. A pre-treatment chamber environment may also be created to deliver gas/vapour concentrations and to control operational conditions such as humidity and temperature. Whereas, the normal operation of the process is at or near atmospheric pressure, the ambient environment can be over- or under-pressurised up to the limit of the conditions necessary for creation of the plasma discharge.

The substrate or other device supporting the substrate may be clamped within a frame that interfaces with either the working electrode, the dielectric layer or the grounded electrode, thereby providing for accurate location within the system and physical separation of the electrode/dielectric layer from the gas gap/discharge region. The flow conditions and content of the gas used to provide the chamber with a general background environment may be different from that of the gas used during the plasma treatment process.

The origin and direction of the gas flow may be adjusted during treatment or between treatments to provide for additional variation in plasma conditions during a treatment or in different treatment situations.

A substrate may be treated at a specific location via the process before then moving the substrate to another offset position under the working electrode and treating the substrate again to produce an interference effect between bands of treatment zones.

The plasma and/or gas flow may be monitored and controlled via feedback from electrical, spectroscopic and residual gas analysis techniques.

A secondary or multi-treatment processing stage may be carried out in order to homogeneously or heterogeneously deposit and/or polymerise monomers and/or oligomers using other forms of plasma or related processing or using the above gradient technology.

The substrate may be arranged on a secondary material of known chemistry having elements and or functionalities that would be useful when transferred to the substrate. Both the substrate and substrate holder may then be subjected to the plasma so as to transfer some of the chemical moieties from the secondary material to the substrate surface in the process.

The electrode gap may be changed dynamically during or between the plasma treatments in order to create variations in the surface treatment throughout rotation of the substrate. This can be achieved using a suitable mechanism that is capable of adjusting the working electrode height throughout the process of platen rotation. The electrode gap change may or may not be distinct from the gas gap (between gas distributor and platen). Additionally, in tandem or as a separate function, an alternative mechanism can be used to adjust the voltage signal used to set the power level (by changing the voltage across the discharge gap) in a manner that varies this dynamically during processing.

An important feature of the adjustment of power and/or electrode gap parameters, in synchronisation or otherwise, is the subsequent distribution and specific intensity of treatment zones. For example, at smaller electrode gaps the microfilaments that comprise the discharge region may be greater in number and distributed within a smaller area producing a more homogeneous surface treatment. At larger gaps the filaments may be less in number, act over a larger region and carry more power per filament therefore producing a slightly less homogeneous surface treatment. For high power levels the region of treatment and power per microfilament will be higher. Not surprisingly, due to varying chemical bond energies, the relative concentrations of surface chemical functionalities (not just elemental composition) produced on the surface will be highly dependent on the energies dissipated in the discharge. As an example, in nitrogen, ammonia and similar type treatments, primary, secondary, and tertiary ammonium species along with pyridinium, imidazolium and similar components may functionalise the substrate surface. Therefore, by use of a combination of operating parameters throughout a given cycle of 360 degrees, a substrate can be treated with a range of intricate chemistries in a one-step process.

Figure 11:
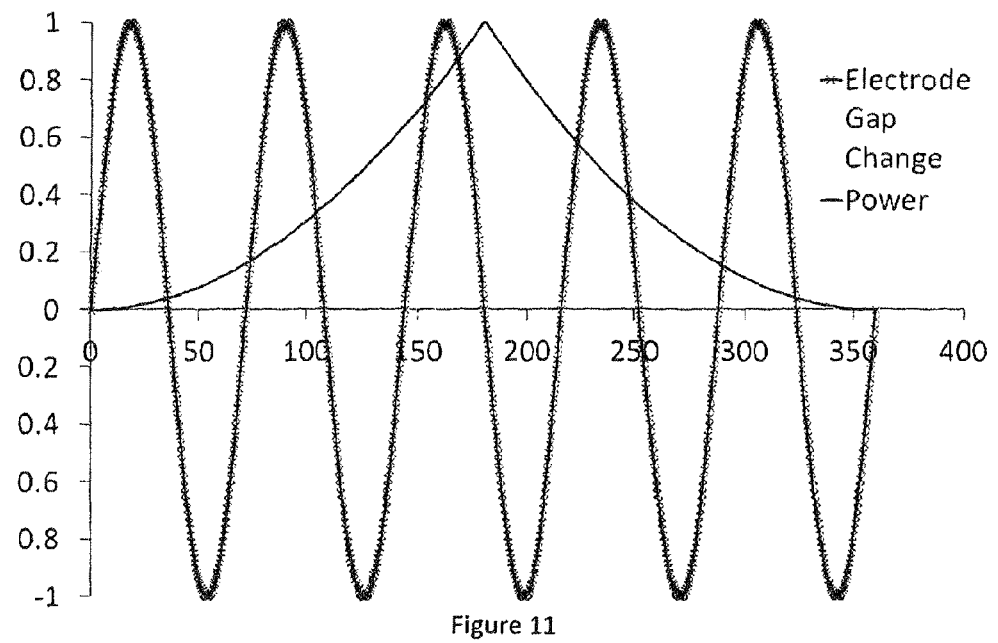
FIG. 11 shows an example of how the gap between the electrodes and the power supplied to the electrodes may vary with rotation of the substrate.

FIG. 11 shows an example of how the electrode gap and power may be varied during a single revolution of the substrate. The y-axis represents an overlap of variation in size of the electrode gap and power and the x-axis represents the angle of rotation of the substrate. In this example, the electrode gap size oscillates a plurality of times and the power increases and then decreases for each revolution of the substrate. In such circumstances, the substrate would show variations in the effects of surface modification around the circumference of the substrate in addition to across its radius.

The variations in electrode gap and power described previously can alternatively be achieved in a manner similar to the effects obtained above by using any form of electrode configuration conducive to delivering the effects of DBD processing, e.g. by using gearing and cams connected to the electrode drive system in a linear or reel to reel system. This could be considered as an additional form of this invention. However, it is more difficult to also incorporate the substrate transit speed changes to be as effective across a substrate of this size in a linear drive and especially in a perpendicular plane.

As noted previously, this processing treatment typically extends nanometers into the substrate surface region with the actual extent of substrate modification and the chemical composition within this modified region/depth being gradated. The nature of this gradual change in properties into the substrate surface is a function of a number of parameters including the plasma conditions adjacent to the surface. It may also be affected by exposure to the atmosphere present after processing. Therefore, control of post-processing conditions may be necessary.

Any system configuration that allows for changes in operating parameters during rotation may provide a treatment method for disc shaped substrates with gradients produced in three dimensions, where every point on the surface is treated in a different manner. Each disc may provide a full array of modification from one particular combination of chamber/pre-process, flow/process gas environment and number of cycles for a particular substrate. In the example described here, the energy density generated at the outer edge of the disc is ¼ of that at the more central region due to the variation in speed of the substrate relative to the upper electrode at the two points, allowing cycle numbers in powers of four to be used to create distinctive regions. For example, substrates treated with 1, 4, 16, 64, 256 cycles in separate regions will cover a very extensive range of energy densities in this respect. On the basis of this, nitrogen flow was controlled over the discharge region during processing producing the effects shown in FIGS. 12 and 13.

Figure 12:
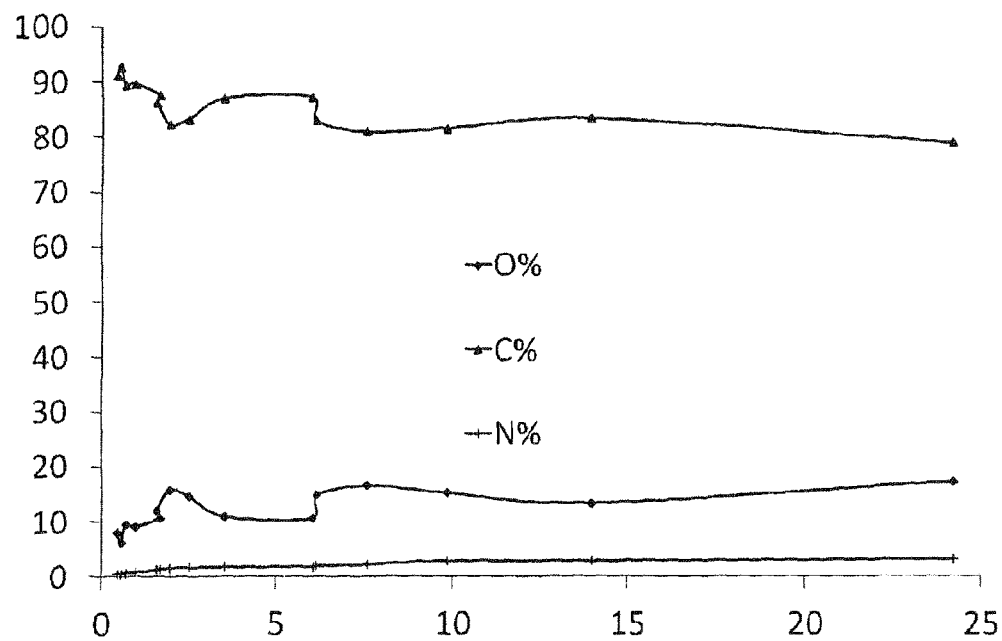
FIG. 12 shows the concentrations of carbon, oxygen and nitrogen on a substrate surface plotted as a function of plasma energy density.

FIG. 12 shows an example of the elemental composition of carbon, oxygen and nitrogen detected by XPS on the substrate surfaces plotted as a function of energy density (x-axis). Three samples were treated in the same manner while varying the number of cycles, i.e. 4 cycles, 15 cycles, 60 cycles. By considering a position in the central region of the platen for a treatment of 4 cycles as the relative outside edge for a treatment of 15 cycles (and follow this through for 60 cycles) the relationships shown in FIGS. 12 and 13 were extrapolated.

Figure 13:
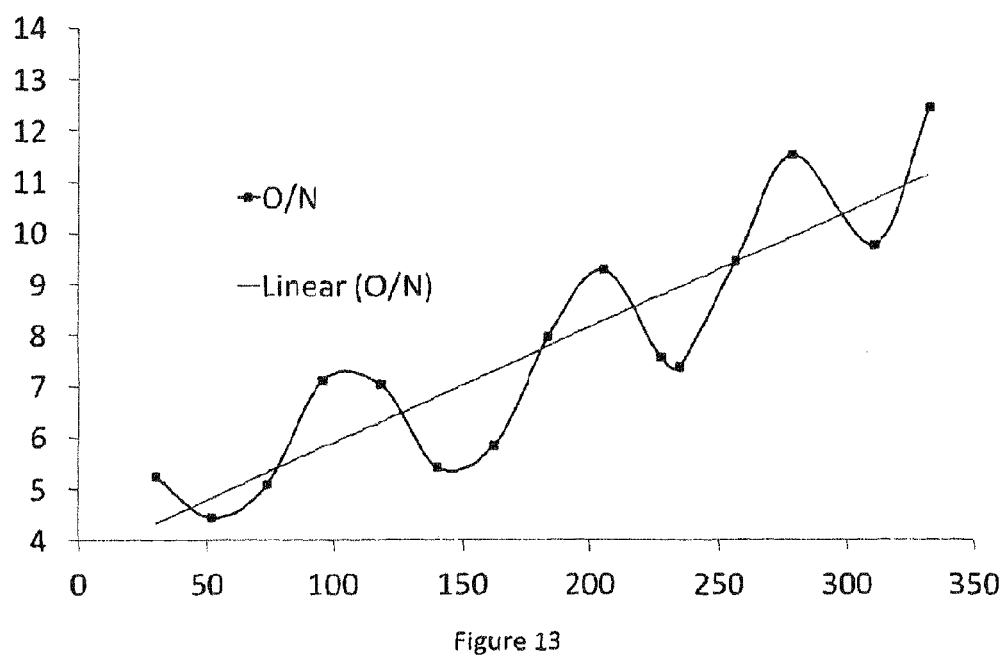
FIG. 13 shows the oxygen to nitrogen ratio on a modified substrate plotted against the position on the substrate.

FIG. 13 shows the oxygen to nitrogen ratio (compared by mass) plotted against the relative (pseudo) radial position along the substrate (recorded in millimeters). As indicated, oscillations in the oxygen to nitrogen ratio were detected across the experimental range investigated providing useful reference points for the effects along the direction of the radius of the platen. Hence, control of the system set-up can be used to drive the surface changes induced across the plane of the first electrode.

Figure 17:
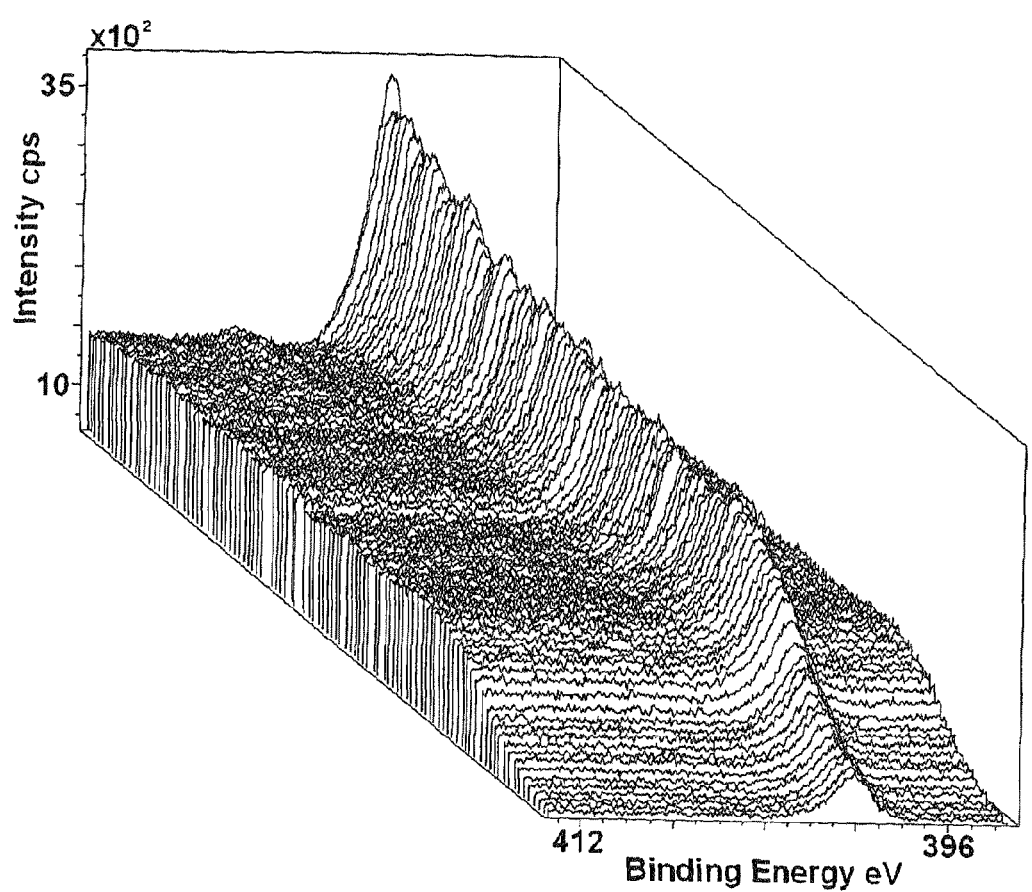
FIGS. 17 and 18 show an example of stacked nitrogen and oxygen XPS images for a PP substrate treated in a nitrogen and ammonia environment.
Figure 18:
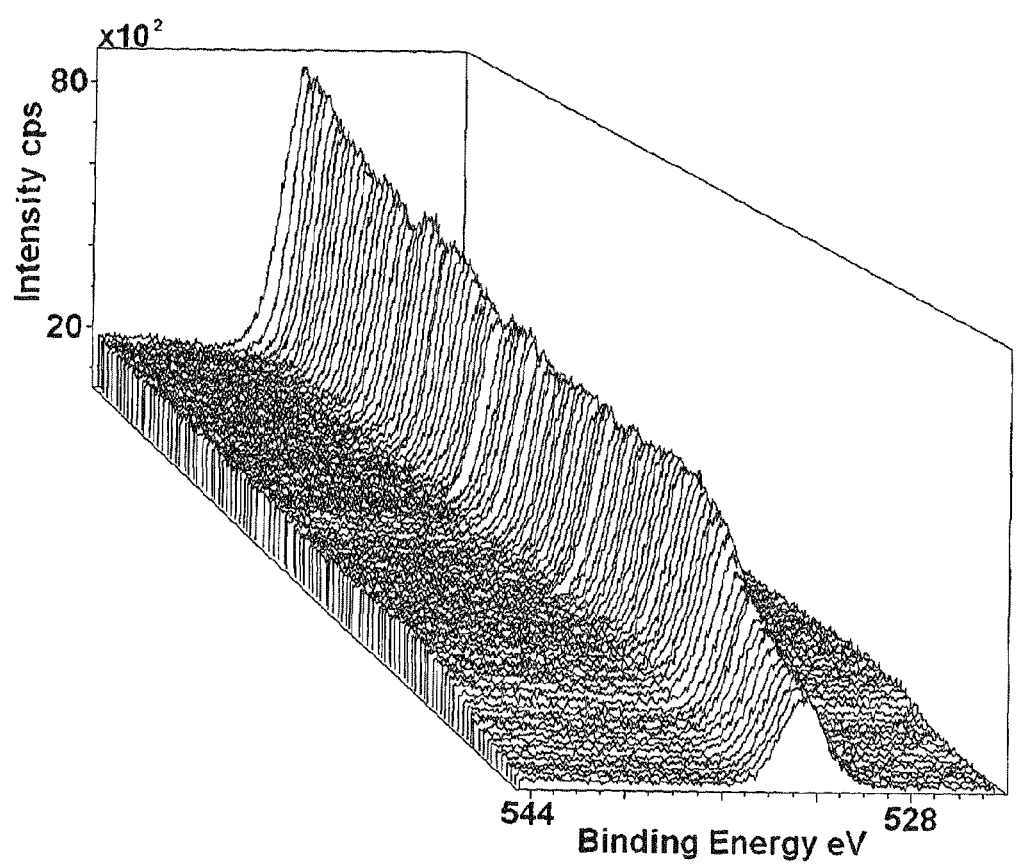

FIGS. 17 and 18 show an example of stacked nitrogen and oxygen XPS images for a PP substrate treated in a nitrogen and ammonia environment.

Figure 19:
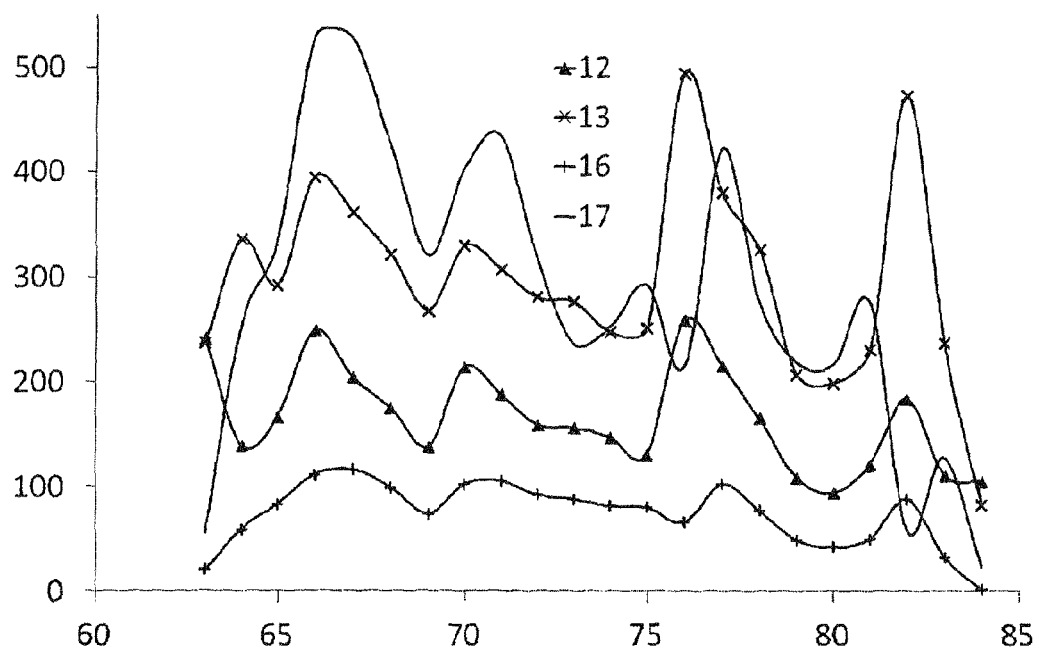
FIG. 19 shows the intensity of atomic masses 12, 13, 16 and 17 detected by TOF-SIMS at various positions along a surface modification gradient on a PP substrate (PP027) after processing with localised gas flow control.

FIG. 19 shows the intensity of atomic masses 12, 13, 16 and 17 detected by TOF-SIMS at various positions along a surface modification gradient on a PP substrate (PP027) after processing with localised gas flow control.

Figure 20:
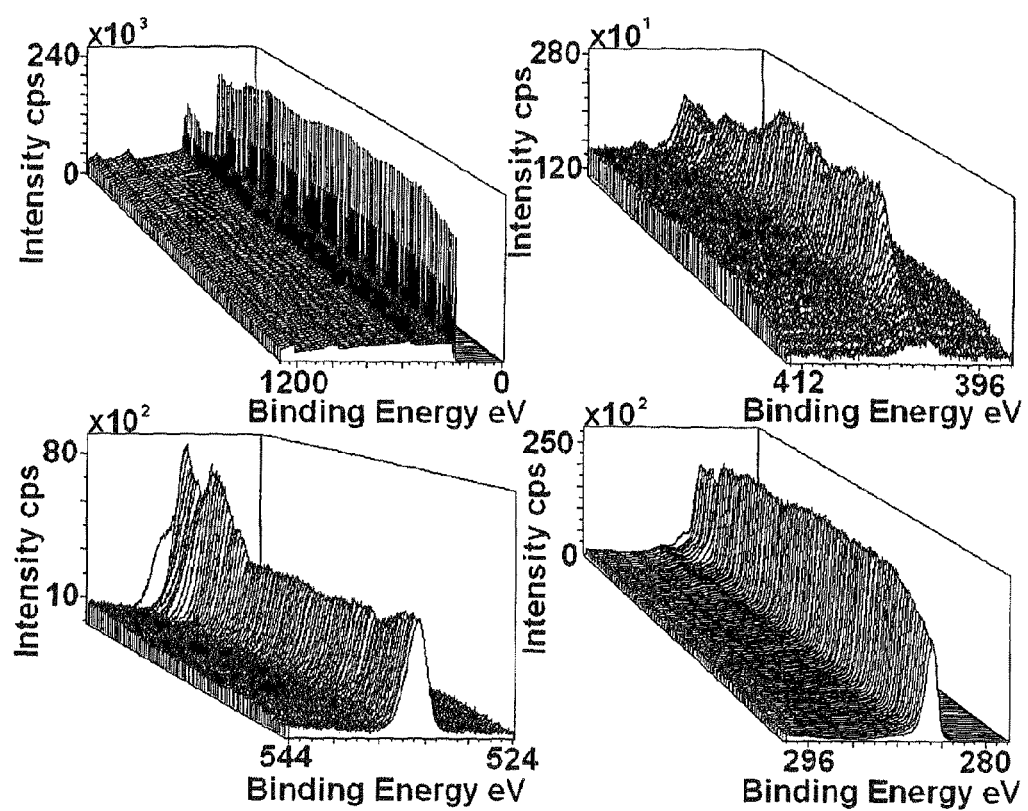
FIG. 20 shows an example of Stacked XPS images indicating nitrogen and nitrogen:oxygen ratio increase in central region of the strip increase as a result of control of gas flow positioning during treatment.

FIG. 20 shows an example of Stacked XPS images indicating nitrogen and nitrogen:oxygen ratio increase in central region of the strip increase as a result of control of gas flow positioning during treatment.

Figure 21:
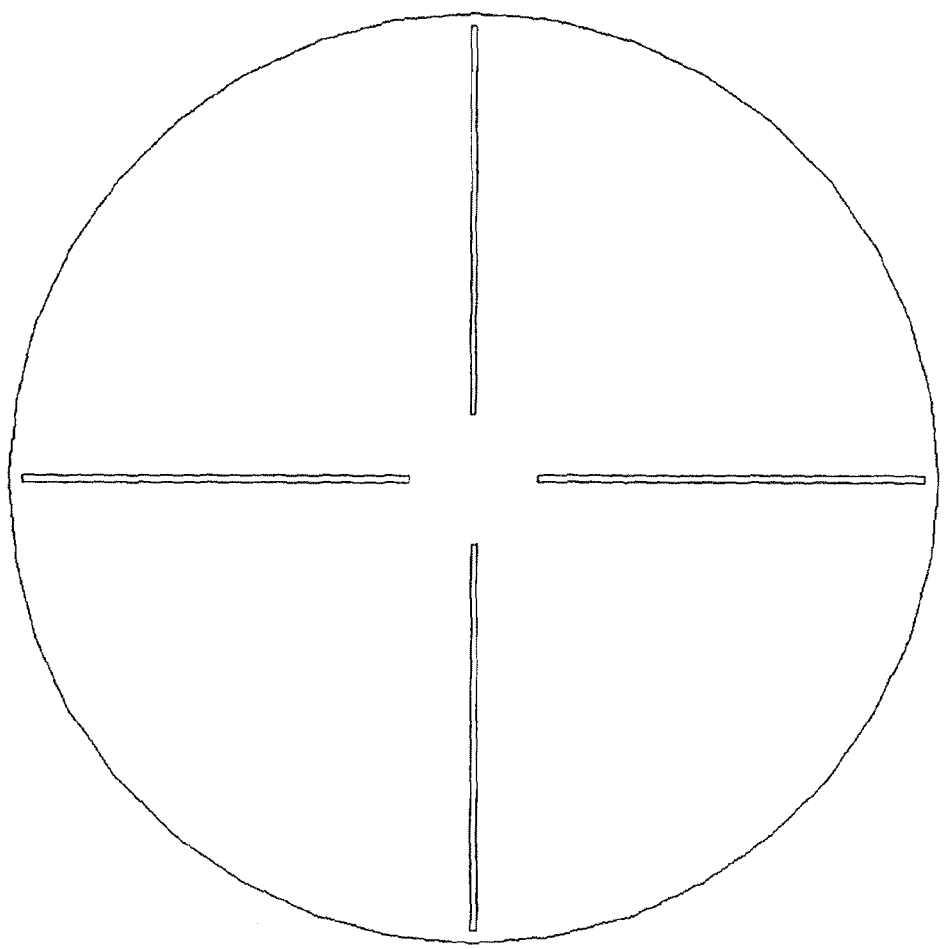
FIG. 21 shows a schematic of an example of an embodiment of multiple electrodes arranged about the axis of rotation within the rotating process.

FIG. 21 shows a schematic of an example of an embodiment where multiple elongated electrodes may be used instead of a single elongated electrode such as that shown in FIG. 2. The multiple elongated electrodes may be arranged to extend outwards from the axis of rotation.

Figure 22:
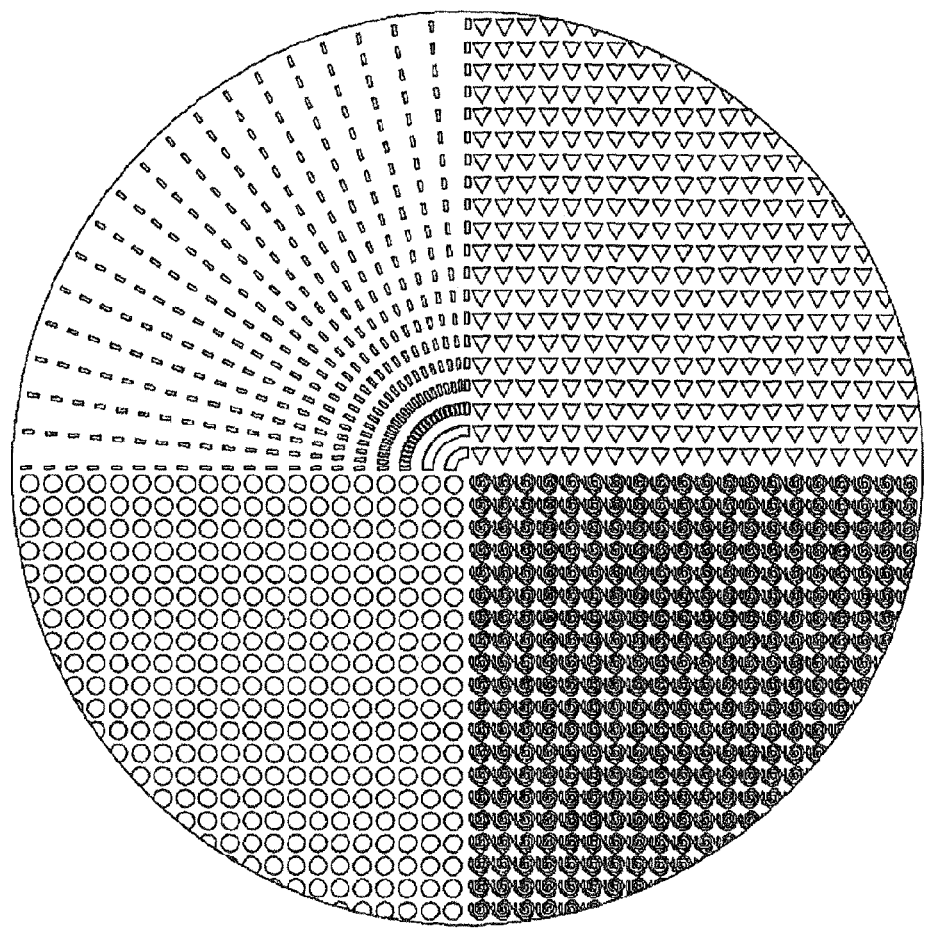
FIG. 22 shows a schematic of an example of an embodiment of surface patterns on the dielectric or electrode material surface within the rotating process.

FIG. 22 shows an embodiment where the platen electrode surface comprises chemical or topological surface patterns. Alternatively, a dielectric material over the platen electrode may comprise such patterns.

Figure 23:
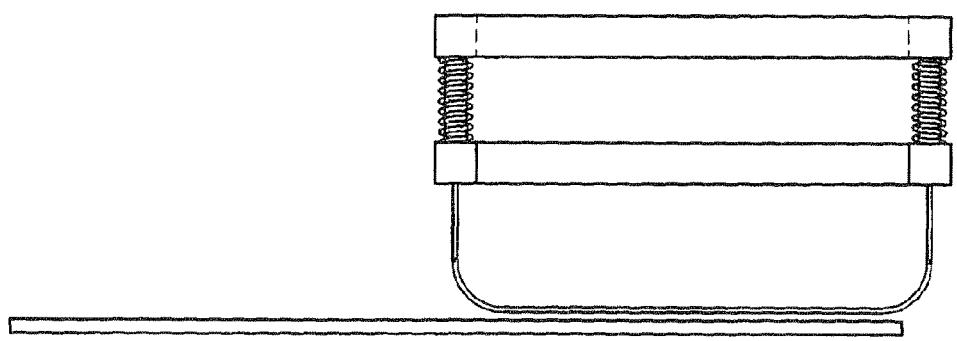
FIG. 23 shows a schematic of an example of the embodiment of a variable height adjustment of electrode gap within the rotating process.

FIG. 23 shows an embodiment for varying the height of the electrode above the substrate and thereby varying the gap between the electrodes. This embodiment generally corresponds to that shown in FIG. 2, except that the electrode arranged above the substrate is mounted to an electrode holder that is connected to adjustable spring mounts. The spring mounts may be selectively adjusted so as to change the gap between the electrodes.

Figure 24A:
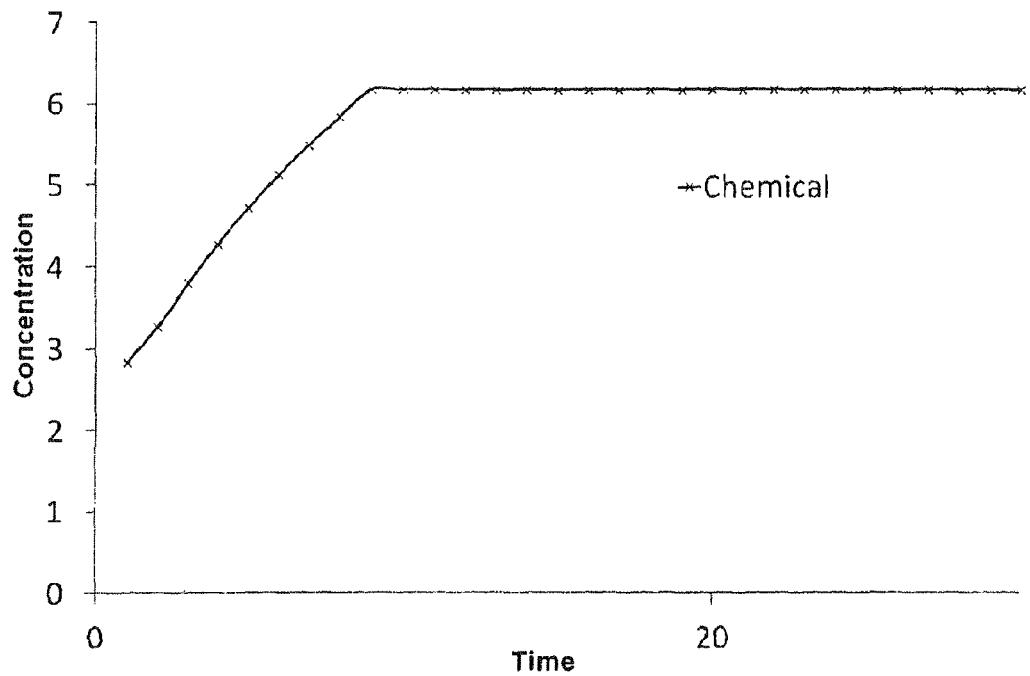
FIG. 24 (a) shows an example of residual gas analysis, and (b) an example flow diagram of an embodiment of chemical delivery to the electrodes.
Figure 24B:
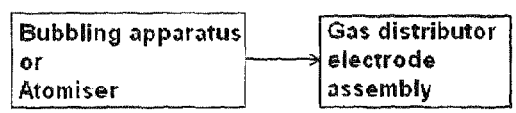

FIG. 24(a) shows an example of the analysis of residual gas between the electrodes and how the concentration of a chemical in the gas may increase over time, since the chemical may be less readily accepted by the substrate as the substrate becomes increasingly modified over time. FIG. 24(b) shows a schematic of the apparatus that may be used to deliver gas between the electrodes. A bubbling apparatus or an atomiser may be used to supply a chemical to the gas distributor, which then distributes the gas between the electrodes.

Figure 25:
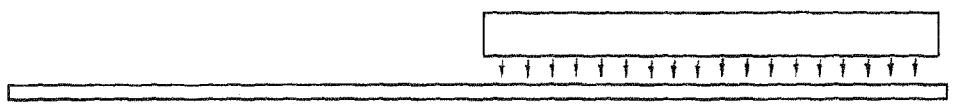
FIG. 25 shows a schematic of an example of an embodiment of an elongated electrode with apertures for gas flow within the rotating process.

FIG. 25 shows a schematic of an embodiment similar to that shown in FIG. 10. The electrode above the substrate is an elongated electrode with apertures in it. A gas may be supplied through this electrode and this gas mat exit the electrode through the apertures and be used in the plasma generating process.

Figure 26:
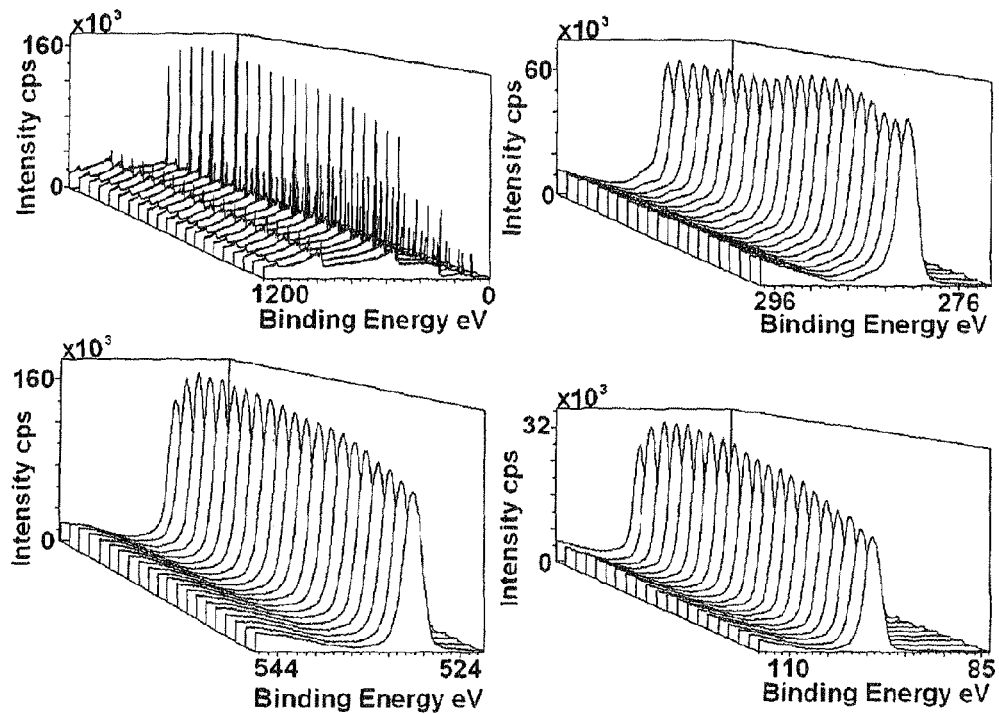
FIG. 26 shows an example of stacked XPS data for a PP substrate plasma treated with hexamethyldisiloxane carried to the electrodes in a helium oxygen mixture.

FIG. 26 shows an example of stacked XPS data for a PP substrate plasma treated with hexamethyldisiloxane carried to the electrodes in a helium oxygen mixture.

Figure 27:
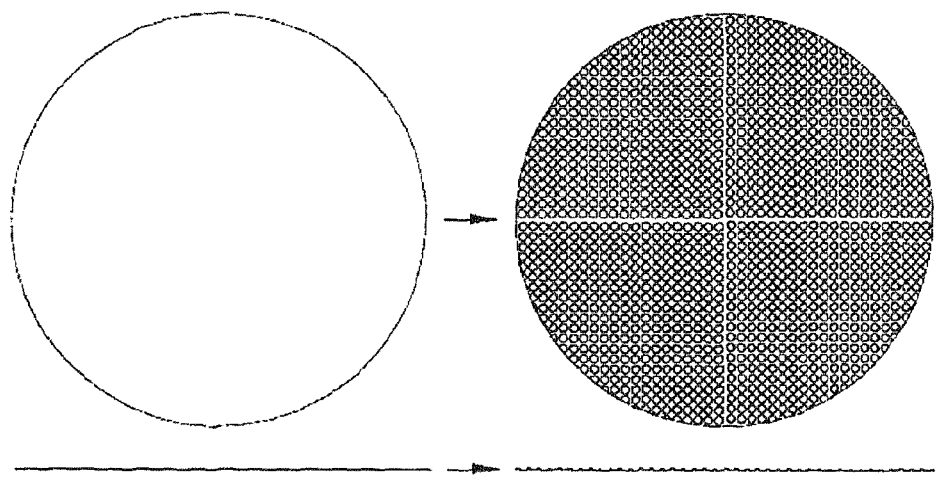
FIG. 27 shows a schematic of an example of an embodiment of vacuum forming of substrates treated within the rotating process to create 3D surface features.

FIG. 27 shows a schematic of an example of an embodiment of vacuum forming of substrates treated within the rotating process to create 3D surface features.

Figure 28:
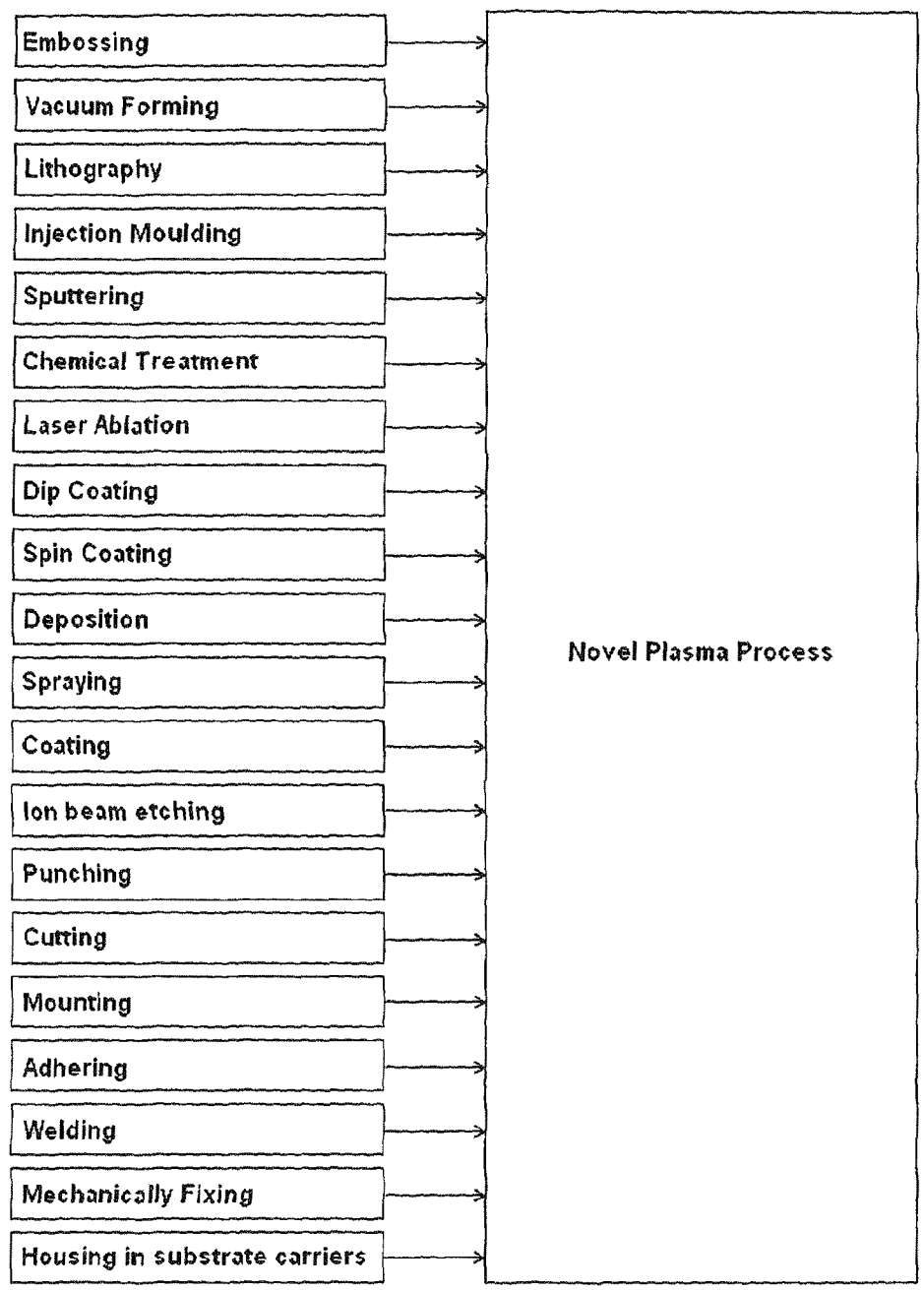
FIG. 28 shows a schematic of examples of embodiments of pre-processing techniques of substrates treated within the rotating process.

FIG. 28 shows a schematic of examples of embodiments of pre-processing techniques of substrates treated within the plasma process.

Figure 29:
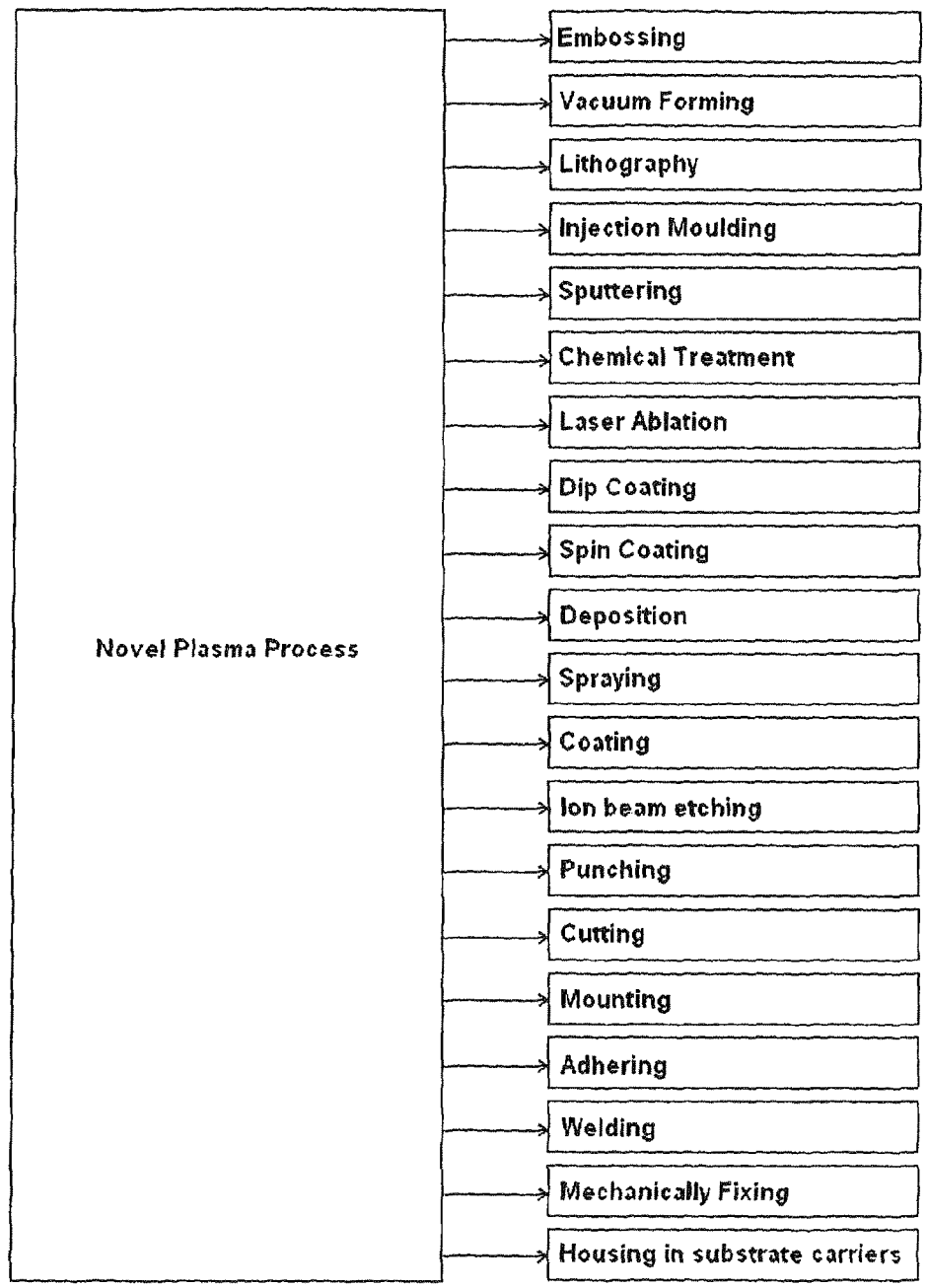
FIG. 29 shows a schematic of examples of embodiments of post-processing techniques of substrates treated within the rotating process.

FIG. 29 shows a schematic of examples of embodiments of post-processing techniques of substrates treated within the rotating process. This Figure is the same as FIG. 28, except that the arrows point in the opposite direction.

Figure 30:
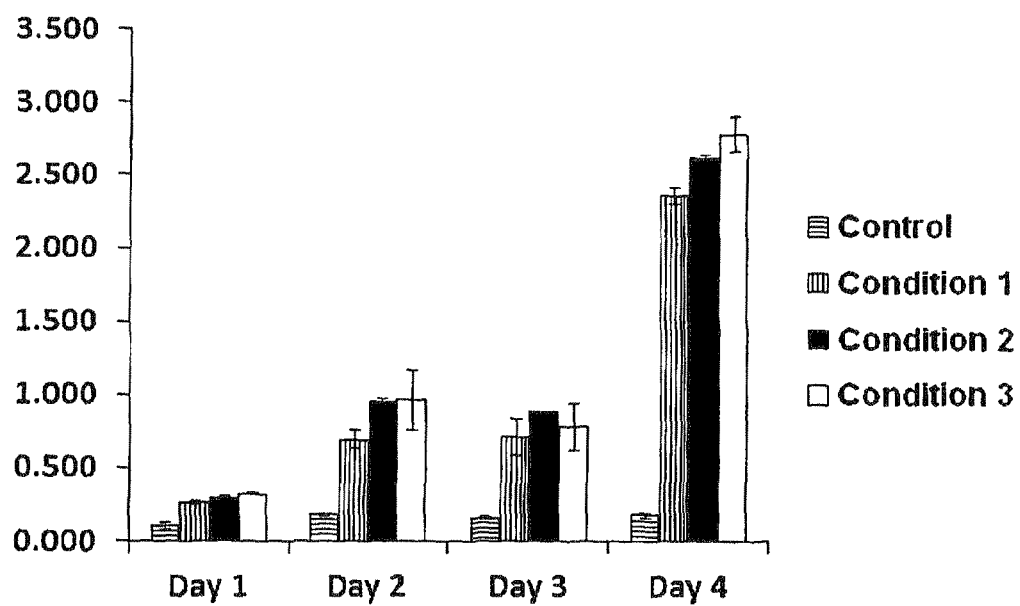
FIG. 30 shows an example of cell surface response to various surface conditions on substrates produced using the plasma process.

FIG. 30 shows an example of cell surface response to various surface conditions on substrates produced using the plasma process. For example, biomolecules may be deposited or immobilised on the substrate subjected to three different plasma conditions. FIG. 30 shows how the cell activity is different for the substrates treated under different plasma conditions and how this activity varies over time.

Surface chemical gradients are useful in a large range of industries and areas of research. For example, the present invention may be useful in surface technologies such as adhesion, coating, painting, plasma treatment, etching, deposition, MEMS, electroplating, electroless plating, optics, polishing, anti-corrosion, anti-fouling, cleaning, laser surface texturing, laser ablation, sputtering, embossing/moulding, self assembled monolayers, electrospinning, spincoating, drug development, catalysis, fuel cell, solar cell, semiconductor, pharmaceuticals, diagnostics, and medical device manufacturing.

The invention may also be useful in the broad area of biomedical engineering and may be applied to laboratory equipment, products and supplies, biomaterials, biocompatible coatings/implants, tissue engineering, in vitro diagnostics, chemo-, immuno-, monoclonal antibody and vaccine therapies in oncology, genetics, bioinstrumentation, nanofabrication, cardiac mapping, wound healing, regenerative medicine, micro and nanoscale devices and nanoscale metrology and analysis. The substrates could be supplied to users with tray frame sets, specialised autoclavable tray frame sets, multi-well/channel substrates and various forms of multiple test devices.

It is important to note that the surface treatment process disclosed here can provide a mechanism by which advanced processes which are dependent on effects that occur in the sub-micron to nanoscale dimension can be used commercially. In this regard, the system may be well suited to alignment with products, companies and markets in the microscopy and spectroscopy fields noted previously, where the technology is surface specific.

It should also be noted that whilst the type of atmospheric pressure plasma used in the system reported here is dielectric barrier discharge, the principle involved applies to all atmospheric processing conditions and those that operate at close to a normal atmosphere state. The terms dielectric barrier discharge and atmospheric pressure plasma are often used interchangeably and should be considered as such in this disclosure without being seen as a limiting factor in the types of plasma that can be covered and protected as part of the process.

The invention claimed is:

1. A method of modifying a substrate using a plasma, comprising:
providing a first electrode and a second electrode;
arranging the substrate such that only a portion of the substrate is between the electrodes;
rotating either the substrate or at least one of the electrodes about an axis so as to cause different portions of said substrate to pass between the electrodes during said rotation; and
supplying a voltage to at least one of the electrodes so as to create a plasma discharge between the electrodes which contacts at least said portions of the substrate that pass between the electrodes;
wherein the second electrode is a wire electrode, a tubular electrode or a rod electrode that extends along the first electrode and in a direction radially outward from said axis of rotation; wherein the electrodes and the substrate are arranged such that said rotating causes the speed of transit of the substrate portion between the electrodes to vary in a radial direction away from the axis of rotation; wherein said electrodes are arranged and said rotation occurs such that an area of the substrate that is further from the axis of rotation passes between the electrodes and is modified by the plasma discharge at lower rate than an area of the substrate that is closer to the axis of rotation and which passes between the electrodes; wherein the plasma modifies the substrate by one or more of the following processes: modifying the substrate surface to include chemical functionalities; depositing monomers or oligomers on the surface; grafting monomers or oligomers on the surface; or polymerising monomers or oligomers on the surface; and wherein the plasma treatment alters the surface chemistry of the substrate surface by different amounts in different areas of the substrate.

2. The method of claim 1, wherein the first electrode extends in a direction perpendicular to the axis of rotation so that the plasma generated between the electrodes contacts an area of said substrate that extends in a direction perpendicular to the axis of rotation.

3. The method claim 1, wherein the electrodes and the substrate are arranged such that the speed of transit of the substrate between the electrodes varies in a radial direction away from the axis of rotation.

4. The method of claim 1, where the plasma occurs at about atmospheric pressure.

5. The method of claim 1 where the plasma is generated by a dielectric barrier discharge process.

6. The method of claim 1, wherein at least a portion of the first electrode and at least a portion of the second electrode are substantially parallel to each other and thereby define a gap between these substantially parallel portions, and wherein said substrate passes through this gap during said step of rotating.

7. The method of claim 1, wherein the substrate is arranged on a platen that is rotated about said axis so as to cause said rotating of the substrate.

8. The method of claim 7, wherein the rotatable platen comprises the first electrode.

9. The method of claim 1, wherein the first and second electrodes are arranged inside a chamber or enclosure and wherein the second electrode remains static relative to the chamber and the first electrode rotates relative to the second electrode.

10. The method of claim 1, wherein the first electrode and/or second electrode is covered in an electrical insulator.

11. The method of claim 1, wherein a potential difference or a current is applied to the electrodes so as to generate the plasma therebetween, and wherein the magnitude of the current or potential difference is varied with time so as to provide different areas of the substrate with different surface modifications or with different degrees of the same modification.

12. The method of claim 1, wherein a potential difference or a current is repeatedly applied to the electrodes so as to generate the plasma therebetween, and wherein the frequency of application of the current or potential difference is varied with time so as to provide different areas of the substrate with different surface modifications or with different degrees of the same modification.

13. The method of claim 1, wherein the distance between the first and second electrodes is dynamically varied with time so as to provide different areas of the substrate with different surface modifications or with different degrees of the same modification.

14. The method of claim 1, wherein one or more type of gas is supplied to the region between the electrodes whilst the plasma is being generated.

15. The method of claim 14, wherein the one or more gas comprises or carries at least one type of chemical which modifies the substrate when the plasma is being generated.

16. The method of claim 14, wherein a plurality of different types of gases are caused to flow into the region at different flow rates.

17. The method of claim 14, wherein a gas distributor is provided for supplying the one or more gas to the region between the electrodes in a non-uniform manner.

18. The method of claim 17, wherein the one or more gas is supplied at a plurality of loci between the electrodes.

19. The method of claim 18, wherein the gas distributor comprises an elongated conduit having a plurality of apertures arranged along its length and located such that the one or more gas exits the conduit through the apertures and is delivered to the region between the first and second electrodes.

20. The method of claim 19, wherein the second electrode comprises the gas distributor and wherein the second electrode is an elongated tube having said apertures.

21. The method of claim 14, wherein the flow rate of the one or more gas into the region between the electrodes varies across the substrate or the flow rate is different through different apertures in the gas distributor.

22. The method of claim 1, wherein the electrodes and substrate are located in a chamber and the substrate is rotatably supported by one or more members, and wherein a magnetic field is passed through one or more walls of the chamber to drive rotation of the one or more support members and hence rotate said substrate.

23. The method of claim 1, comprising providing a plurality of said first electrodes and/or a plurality of said second electrodes such that different separate regions of said substrate pass between the first and second electrodes simultaneously.

24. The method of claim 1, wherein the surface of said first or second electrode, or the surface of a dielectric material covering said first or second electrode, has a chemical or topological pattern thereon.

25. The method of claim 1, further comprising:
dynamically varying the spacing between the electrodes with time whilst the plasma is being generated.

26. The method of claim 1, further comprising:
supplying gas between at least one of the electrodes and the substrate at a plurality of loci using a gas distributor, wherein the gas distributor comprises an elongated conduit having a plurality of apertures arranged along its length and located such that the gas exits the conduit through the apertures and is delivered to said loci.

27. The method of claim 26, wherein the gas has different flow rates through different apertures.

28. The method of claim 1,
wherein at least one of the electrodes has a conduit and a plurality of apertures extending from the conduit to the outside of the electrode, said method further comprising:
supplying a gas through the conduit so that it flows out of the at least one electrode through said apertures.

29. The method of claim 28, further comprising the subsequent step of vacuum forming the modified substrate to provide a 3-dimensional surface form.

30. The method of claim 28, further comprising processing the substrate prior to exposing it to said plasma, said processing being by one or more of the following techniques: embossing, vacuum forming, lithography, injection moulding, sputtering, chemical treatment (e.g. using silane derivatives), laser ablation, dip coating, spin coating, deposition, spraying, coating, ion beam etching, punching, cutting, mounting, adhering, welding, mechanically fixing or housing in substrate carriers.

31. The method of claim 28, further comprising processing the substrate after having exposed it to said plasma, said processing being by one or more of the following techniques: embossing, vacuum forming, lithography, injection moulding, sputtering, chemical treatment (e.g. using silane derivatives), biomaterial deposition, laser ablation, dip coating, spin coating, deposition, spraying, coating, ion beam etching, punching, cutting, mounting, adhering, welding, mechanically fixing or housing in substrate carriers.

32. The method of claim 28, where biomolecules are deposited or immobilized on the substrate.

33. A method of modifying a substrate using a plasma, comprising:
providing a first electrode and a second electrode, wherein at least one of the electrodes has a first conduit and a first plurality of apertures extending from the first conduit to the outside of the electrode;
providing a substrate to be treated between the electrodes;
arranging the substrate such that only a portion of the substrate is between the electrodes;
rotating either the substrate or at least one of the electrodes about an axis so as to cause different portions of said substrate to pass between the electrodes during said rotation;
supplying a first gas through the first conduit so that it flows out of the at least one electrode through said first plurality of apertures;
supplying a second gas between at least one of the electrodes and the substrate at a plurality of loci using a gas distributor, wherein the gas distributor comprises an elongated, second conduit having a second plurality of apertures arranged along its length and located such that the second gas exits the second conduit through the second apertures and is delivered to said loci;
supplying a voltage to at least one of the electrodes so as to create a plasma discharge between the electrodes which contacts at least the portion or said portions of the substrate that pass between the electrodes;
dynamically varying the spacing between the electrodes with time whilst the plasma is being generated; and
arranging a substrate to be treated in contact with the plasma so as to modify a surface of the substrate;
wherein the second electrode is a wire electrode, a tubular electrode or a rod electrode that extends along the first electrode and in a direction radially outward from said axis of rotation; wherein the electrodes and the substrate are arranged such that said rotating causes the speed of transit of the substrate portion between the electrodes to vary in a radial direction away from the axis of rotation; wherein said electrodes are arranged and said rotation occurs such that an area of the substrate that is further from the axis of rotation passes between the electrodes and is modified by the plasma discharge at lower rate than an area of the substrate that is closer to the axis of rotation and which passes between the electrodes; wherein the plasma modifies the substrate by one or more of the following processes: modifying the substrate surface to include chemical functionalities; depositing monomers or oligomers on the surface; grafting monomers or oligomers on the surface; or polymerising monomers or oligomers on the surface; and wherein the plasma treatment alters the surface chemistry of the substrate surface by different amounts in different areas of the substrate.

* * * * *